US007148579B2

(12) United States Patent
Pinkerton et al.

(10) Patent No.: US 7,148,579 B2
(45) Date of Patent: Dec. 12, 2006

(54) ENERGY CONVERSION SYSTEMS UTILIZING PARALLEL ARRAY OF AUTOMATIC SWITCHES AND GENERATORS

(75) Inventors: Joseph F. Pinkerton, Austin, TX (US); John C. Harlan, Leander, TX (US)

(73) Assignee: Ambient Systems, Inc., Austin, TX (US)

( * ) Notice: Subject to any disclaimer, the term of this patent is extended or adjusted under 35 U.S.C. 154(b) by 0 days.

(21) Appl. No.: 10/453,373

(22) Filed: Jun. 2, 2003

(65) Prior Publication Data

US 2004/0239119 A1 Dec. 2, 2004

(51) Int. Cl.
*H02P 9/04* (2006.01)
*F02B 63/04* (2006.01)
*F03G 7/08* (2006.01)
*H02Y 7/08* (2006.01)

(52) U.S. Cl. .................................. 290/1 R; 977/DIG. 1
(58) Field of Classification Search ................ 290/1 R, 290/1 A; 310/309, 307, 306; 257/596, 419; 250/306; 977/DIG. 1; 136/205, 208; 60/528
See application file for complete search history.

(56) References Cited

U.S. PATENT DOCUMENTS

| | | |
|---|---|---|
| 2,979,551 A | 4/1961 | Pack |
| 3,181,365 A | 5/1965 | Maninger |
| 3,252,013 A | 5/1966 | Stanton |
| 3,365,653 A | 1/1968 | Gabor et al. |
| 3,495,101 A | 2/1970 | Slonneger |
| 3,500,451 A | 3/1970 | Yandon |
| 3,508,089 A | 4/1970 | Cheshire |
| 3,609,593 A | 9/1971 | Boll et al. |
| 4,152,537 A * | 5/1979 | Hansch ...................... 136/208 |
| 4,387,318 A | 6/1983 | Kolm et al. |

(Continued)

FOREIGN PATENT DOCUMENTS

DE 101 28 876 A 11/2002

(Continued)

OTHER PUBLICATIONS

Halliday et al.; "Physics. Third Edition"; John Wiley & Sons, Inc.; 1978; pp. 529-531.

(Continued)

*Primary Examiner*—Julio Gonzalez
(74) *Attorney, Agent, or Firm*—Fish & Neave IP Group of Ropes & Gray LLP; Robert W. Morris; Jeffrey D. Mullen

(57) ABSTRACT

Nanoelectromechanical systems utilizing nanometer-scale assemblies are provided that convert thermal energy into another form of energy that can be used to perform useful work at a macroscopic level. These systems may be used to, for example, produce useful quantities of electric or mechanical energy, heat or cool an external substance or propel an object in a controllable direction. In particular, the present invention includes nanometer-scale beams that reduce the velocity of working substance molecules that collide with this nanometer-scale beam by converting some of the kinetic energy of a colliding molecule into kinetic energy of the nanometer-scale beam. In embodiments that operate without a working substance, the thermal vibrations of the beam itself create the necessary beam motion. In some embodiments, an automatic switch is added to realize a regulator such that the nanometer-scale beams only deliver voltages that exceed a particular amount. Various devices including, piezoelectric, electromagnetic and electromotive force generators, are used to convert the kinetic energy of the nanometer-scale beam into electromagnetic, electric or thermal energy. Systems in which the output energy of millions of these devices is efficiently summed together are also disclosed as well as systems that include nanometer-scale transistors.

72 Claims, 28 Drawing Sheets

U.S. PATENT DOCUMENTS

| | | | |
|---|---|---|---|
| 4,536,674 A | 8/1985 | Schmidt | |
| 4,595,864 A | 6/1986 | Stiefelmeyer et al. | |
| 4,814,657 A | 3/1989 | Yano et al. | |
| 4,966,649 A | 10/1990 | Harada et al. | |
| 5,065,085 A | 11/1991 | Aspden et al. | |
| 5,132,934 A | 7/1992 | Quate et al. | |
| 5,216,631 A | 6/1993 | Sliwa, Jr. | |
| 5,578,976 A | 11/1996 | Yao | |
| 5,619,061 A | 4/1997 | Goldsmith et al. | |
| 5,621,258 A | 4/1997 | Stevenson | |
| 5,638,946 A | 6/1997 | Zavracky | |
| 5,649,454 A | 7/1997 | Midha et al. | |
| 5,677,823 A | 10/1997 | Smith | |
| 5,768,192 A | 6/1998 | Eitan | |
| 5,780,727 A | 7/1998 | Gimzewski et al. | |
| 5,835,477 A | 11/1998 | Binnig et al. | |
| 5,964,242 A * | 10/1999 | Slocum | 137/240 |
| 6,011,725 A | 1/2000 | Eitan | |
| 6,054,745 A | 4/2000 | Nakos et al. | |
| 6,069,540 A | 5/2000 | Berenz et al. | |
| 6,073,484 A | 6/2000 | Miller et al. | |
| 6,114,620 A | 9/2000 | Zuppero et al. | |
| 6,123,819 A | 9/2000 | Peeters | |
| 6,127,744 A | 10/2000 | Streeter et al. | |
| 6,127,765 A | 10/2000 | Fushinobu | |
| 6,157,042 A | 12/2000 | Dodd | |
| 6,160,230 A | 12/2000 | McMillan et al. | |
| 6,256,767 B1 * | 7/2001 | Kuekes et al. | 716/9 |
| 6,261,469 B1 | 7/2001 | Zakhidov et al. | |
| 6,300,756 B1 | 10/2001 | Sturm et al. | |
| 6,327,909 B1 | 12/2001 | Hung et al. | |
| 6,424,079 B1 | 7/2002 | Carroll | |
| 6,433,543 B1 | 8/2002 | Shahinpoor et al. | |
| 6,445,006 B1 | 9/2002 | Brandes et al. | |
| 6,445,109 B1 | 9/2002 | Per.cedilla.in et al. | |
| 6,509,605 B1 | 1/2003 | Smith | |
| 6,515,339 B1 | 2/2003 | Shin et al. | |
| 6,528,785 B1 * | 3/2003 | Nakayama et al. | 250/306 |
| 6,548,841 B1 * | 4/2003 | Frazier et al. | 257/254 |
| 6,559,550 B1 * | 5/2003 | Herman | 290/1 R |
| 6,574,130 B1 | 6/2003 | Segal et al. | |
| 6,593,666 B1 * | 7/2003 | Pinkerton | 290/1 R |
| 6,593,731 B1 | 7/2003 | Roukes et al. | |
| 6,597,048 B1 | 7/2003 | Kan | |
| 6,611,033 B1 | 8/2003 | Hsu et al. | |
| 6,643,165 B1 | 11/2003 | Segal et al. | |
| 6,653,547 B1 * | 11/2003 | Akamatsu | 136/205 |
| 6,669,256 B1 | 12/2003 | Nakayama et al. | |
| 6,672,925 B1 | 1/2004 | Talin et al. | |
| 6,674,932 B1 | 1/2004 | Zhang et al. | |
| 6,685,810 B1 * | 2/2004 | Noca et al. | 204/450 |
| 6,708,491 B1 | 3/2004 | Weaver et al. | |
| 6,722,200 B1 | 4/2004 | Roukes et al. | |
| 6,730,370 B1 * | 5/2004 | Olafsson | 427/596 |
| 6,756,795 B1 * | 6/2004 | Hunt et al. | 324/701 |
| 6,762,116 B1 | 7/2004 | Skidmore | |
| 6,774,533 B1 * | 8/2004 | Fujita et al. | 310/309 |
| 6,803,840 B1 | 10/2004 | Kowalcyk et al. | |
| 6,805,390 B1 * | 10/2004 | Nakayama et al. | 294/99.1 |
| 6,806,624 B1 | 10/2004 | Lee | |
| 6,828,800 B1 | 12/2004 | Reich | |
| 6,846,682 B1 | 1/2005 | Heath et al. | |
| 6,882,051 B1 | 4/2005 | Majumdar et al. | |
| 6,911,682 B1 | 6/2005 | Rueckes et al. | |
| 6,914,329 B1 * | 7/2005 | Lee et al. | 257/712 |
| 6,953,977 B1 | 10/2005 | Mlcak et al. | |
| 2002/0024099 A1 * | 2/2002 | Watanabe et al. | 257/368 |
| 2002/0039620 A1 | 4/2002 | Shahlnpoor et al. | |
| 2002/0043895 A1 | 4/2002 | Richards et al. | |
| 2002/0153583 A1 * | 10/2002 | Frazier et al. | 257/448 |
| 2002/0167374 A1 | 11/2002 | Hunt et al. | |
| 2002/0175408 A1 | 11/2002 | Majumdar et al. | |
| 2002/0180306 A1 | 12/2002 | Hunt et al. | |
| 2003/0036332 A1 | 2/2003 | Talin | |
| 2003/0172726 A1 * | 9/2003 | Yasutake et al. | 73/105 |
| 2003/0175161 A1 | 9/2003 | Gabriel et al. | |
| 2004/0012062 A1 * | 1/2004 | Miyajima et al. | 257/419 |
| 2004/0157304 A1 | 8/2004 | Guo | |
| 2004/0239210 A1 | 12/2004 | Pinkerton et al. | |
| 2004/0240252 A1 * | 12/2004 | Pinkerton et al. | 365/151 |
| 2005/0037547 A1 * | 2/2005 | Berlin et al. | 438/142 |
| 2005/0104085 A1 * | 5/2005 | Pinkerton et al. | 257/183 |
| 2005/0179339 A1 | 8/2005 | Pinkerton et al. | |

FOREIGN PATENT DOCUMENTS

| | | |
|---|---|---|
| EP | 0518283 | 12/1992 |
| EP | 0977345 | 2/2000 |
| JP | 02004516 | 1/1990 |
| WO | WO 01/03208 | 1/2001 |
| WO | WO 0120760 | 3/2001 |
| WO | WO 0193343 | 12/2001 |
| WO | WO 02/080360 | 10/2002 |
| WO | WO 03/021613 A | 3/2003 |
| WO | WO 03/078305 | 9/2003 |
| WO | WO 03/001657 | 10/2003 |

OTHER PUBLICATIONS

Dresselhaus et al.; "Carbon Nanotubes: Synthesis, Structure, Properties, and Applications"; Springer-Verlag Berlin Heidelberg 2001; pp. 198-199, 292-293.

Kinaret J.M. et al. "A Carbon-Nanotube-Based Nanorelay", Applied Physics Letters, American Institute of Physics, New York, USA, vol. 8, No. 8, pp. 1287-1289, Feb. 24, 2003.

U.S. Appl. No. 60/449,371, filed Feb. 21, 2003, Mullen.

U.S. Appl. No. 10/785,289, filed Feb. 23, 2004, Mullen.

Database Inspec Online!, Institute of Electrical Engineers, Stevenage, GB; Ponomarenko et al. "Properties of boron carbon nanotubes: density-functional-based tight-binding calculations," Database accession No. 7588110, XP002278946, abstract Physical Review B (Condensed Matter and Material Physics), vol. 67, No. 12, pp. 125401-1-5, Mar. 15, 2003.

Sung et al. "Well-aligned carbon nitride nanotubes synthesized in anodic alumina by electron cyclotron resonance chemical vapor deposition," Applied Physics Letters, vol. 74, No. 2, pp. 197-199, Jan. 11, 1999.

Rueckes et al., "Carbon nanotube-based nonvolatile random access memory for molecular computing," Science, vol. 289 (Jul. 7, 2000), pp. 94-97.

Halg, Beat, "On a micro-electro-mechanical nonvolatile memory cell," IEEE Trans., Electron Devices, vol. 37, No. 10 (Oct. 1990) pp. 2230-2236.

White D R et al., "The status of Johnson Noise Thermometry," Metrologia Bur. Int. Polds & Measures, France, vol. 33, 1996, pp. 325-335.

Cleland el at., "Fabrication of High Frequency Nanometer Scale Mechanical Resonators from Bulk Si Crystals," Appl. Phys. Lett., vol. 69, No. 18, Oct. 28, 1996, pp. 2653-2655.

Baughman et al. "Carbon Nanotube Actuators," Science American Association for the Advancement of Science, U.S., vol. 284, May 21, 1999, pp. 1340-1344.

Dequesnes M et al., "Calculation of pull-in voltages for carbon-nanotube-based nanoelectromechanical switches," nanotechnology IOP publishing UK, vol. 13, Jan. 22, 2002, pp. 120-131.

* cited by examiner

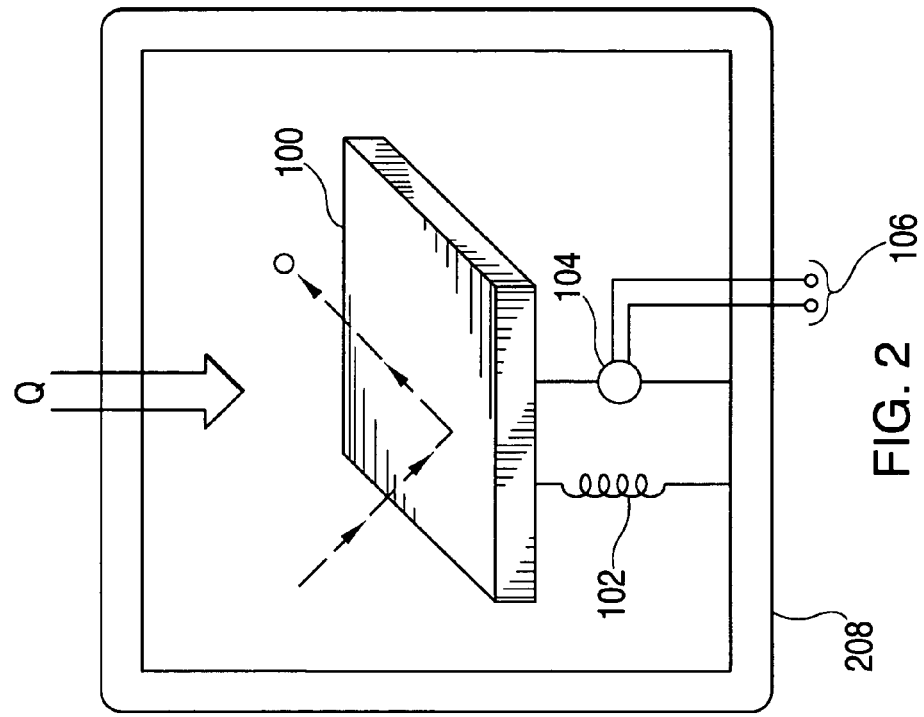
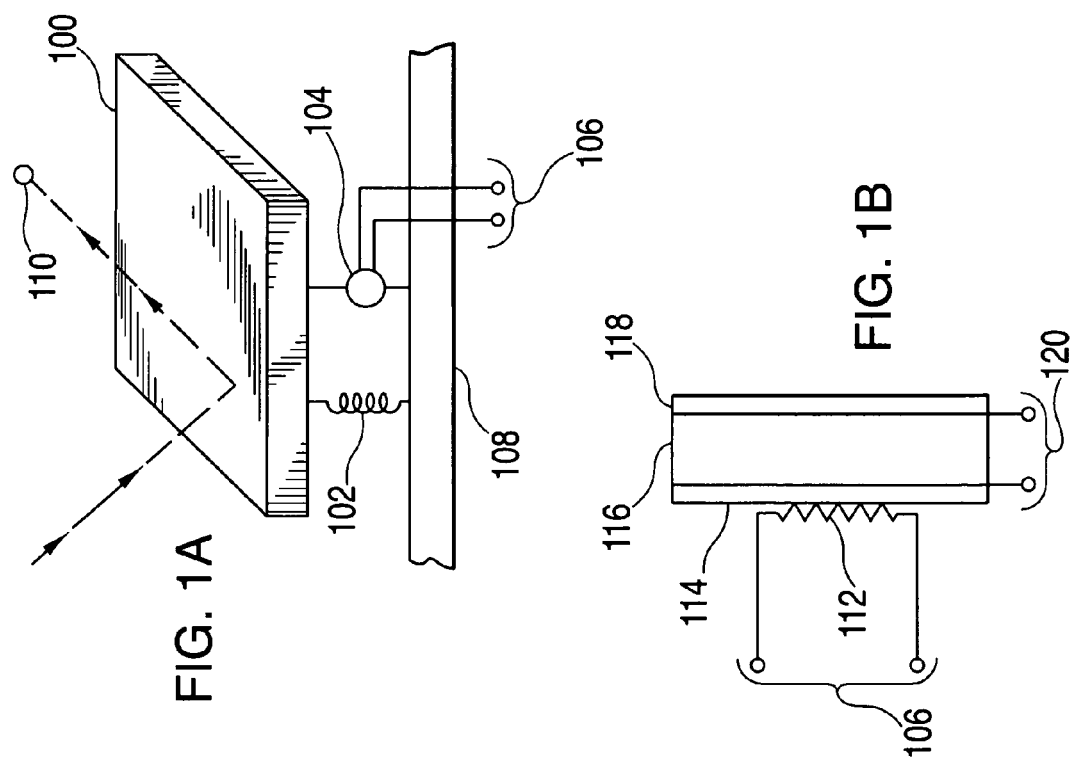

ENERGY CONVERSION SYSTEMS UTILIZING PARALLEL ARRAY OF AUTOMATIC SWITCHES AND GENERATORS

BACKGROUND OF THE INVENTION

This invention relates to nanometer scale electromechanical systems. In particular, the present invention relates to nanometer scale electromechanical systems that may be used in various applications, such as heat engines, heat pumps, or propulsion systems.

Electromechanical systems that rely on molecular motion are known. For example, U.S. Pat. No. 4,152,537 (the "'537 patent"), describes an electricity generator that produces electrical energy from the random movement of molecules in a gas, and the uneven distribution of thermal energy in different molecules of the gas, which is at an overall uniform temperature.

Other such systems are described in, for example, U.S. Pat. Nos. 3,365,653; 3,495,101, 2,979,551; 3,609,593; 3,252,013 and 3,508,089. These systems produce electricity or devices driven by electricity, such as an oscillator, based on molecular motion and thermal energy.

One problem common to all of these systems is the low level of output power when compared to the amount of power required to operate the systems. For example, such systems often require a certain amount of energy to maintain the systems at a constant overall temperature. While the '537 patent attempted to address some of the known deficiencies in such systems, the electricity generator described therein also suffers from similar deficiencies. For example, the '537 patent attempts to heat the thermocouple junction between two dissimilar materials by simply being in contact with a gas-molecule having an above-average speed. In addition, the '537 patent utilizes an array of electrical rectifiers (see, e.g., rectifier bridge 40 in FIGS. 2 and 4) that may have difficulty in operating properly due to the infinitesimally small voltages produced at the molecular scale.

Moreover, as the use of electronic devices continues to flourish, there is an ever increasing need to provide more efficient and/or quieter ways to cool the components that are typically the heart of such devices. For example, most personal computers include one or more fans that are required to maintain the temperature of the microprocessor within a certain operational range. These fans are often noisy, and often result in large quantities of dirty air being pulled through the computer from the air intakes.

Accordingly, it is an object of the present invention to provide nanometer scale electromechanical systems that efficiently convert molecular-level energy into another form that can be used at a macroscopic scale.

Another object of the present invention is to provide nanometer scale electromechanical systems that efficiently convert molecular-level heat energy into useful mechanical and/or electrical energy.

A still further object of the present invention is to provide nanometer scale electromechanical systems that utilize molecular-level energy to create a pressure differential on a surface of an object to propel the object in a controllable direction.

An even further object of the present invention is to provide nanometer scale electromechanical systems that utilize molecular-level energy to heat or cool an external substance.

SUMMARY OF THE INVENTION

This application improves upon U.S. patent application Ser. No. 09/885,367, filed Jun. 20, 2001, which is herein incorporated by reference in its entirety.

The nanometer scale electromechanical systems of the present invention efficiently convert molecular-level energy from one form into another form by reducing the velocity of the molecules within the working substance. These systems may include, for example, a heat engine that converts molecular-level heat energy into useful mechanical or electrical energy. Such systems may also include a heat pump that utilizes molecular-level energy to either heat or cool a substance. For example, a system of the present invention may be mounted to a microprocessor as the primary cooling device, so that little or no fans would be necessary. In addition, these systems may also include propulsion systems in which molecular-level energy is utilized to create a pressure differential on the surface of an object, thereby providing the ability to propel that object in a controllable direction.

Nanometer scale electromechanical systems constructed in accordance with the present invention may include a large number of nanometer-sized objects, such as paddles, impact masses, and/or tubes, that are placed in a liquid or gas. These objects may be sized on the order of several nanometers per side, and may have a thickness on the order of about one or two nanometers. One side of the paddle is connected to a flexible, spring-like, attachment, that couples the paddles to a common base. Also attached to each paddle is some form of generator device, such as a piezoelectric, electromotive force or electrostatic generator, that converts random molecular motion into electrical, electromagnetic or thermal energy.

The nanometer-sized paddles, in conjunction with an associated generator, reduce the speed of individual molecules which results in a reduction of thermal energy within the working fluid. The generated electrical energy may be converted back to thermal energy at a higher temperature than the working fluid and used to establish a temperature differential that is capable of performing useful work. Essentially, the paddles are configured to be immersed in a working substance. The paddles move in a random manner within the working substance due to variations in the thermal motion of the molecules of the working substance. This movement necessarily results from collisions between the molecules of the working substance and the paddles which are large enough to cause the paddles to oscillate. The kinetic energy from this oscillation may then be converted into electrical, electromagnetic or thermal energy by various methods, as described above.

Nanometer scale electromechanical systems constructed in accordance with the present invention also provide components that efficiently collect and sum the outputs of the numerous paddles so that a useful electrical output is produced. For example, one embodiment of the present invention includes the use of an array of resistive elements, one for each paddle, that are in contact with one side of the thermocouple. The other side of the thermocouple is placed in thermal contact with something else that is at an ambient temperature (such as a gas or liquid). Each of the thermocouples produces an output (i.e., a DC current and voltage) that can be summed through a simple series connection to produce an output, depending on the number of paddles and configuration, on the order of several milliwatts.

In one particular embodiment, a nanometer scale electromechanical system constructed in accordance with the present invention may include an array of nanotubes, such as tubes made of carbon, which are coupled between two plates of a capacitor. One of the tubes is physically connected to one plate of the capacitor, while the other end is free to move. The entire assembly is immersed in a fluid (i.e., a liquid or a gas). A voltage is applied to the capacitor (across the plates), which creates an electric field ("E") that keeps the length of the tubes perpendicular to the surface of the capacitor plate. The "free" ends of the tubes, which are immersed in a working substance, move erratically due to collisions between the molecules of the working substance and the tubes, causing some of the tubes collide into each other. Kinetic energy of the colliding tubes, as well as other energy, may be converted for one or more useful purposes, as previously described.

In another embodiment of the present invention, numerous nanotubes are connected at each end to an electrically and thermally conductive rail. Each of the tubes is installed such that there is slack, or bend, in the tube. The slack permits the tubes to vibrate in response to random pressure variations from surrounding fluid (gas or liquid). In this case, an external magnetic field ("B") is applied to the entire assembly which is perpendicular to the tubes and rails. Heat generated in the tubes, from the induced current, flows down the tubes to the thermally conductive rails, which are attached to a thermally conductive plate.

Further features of the invention, its nature and various advantages will be more apparent from the accompanying drawings and the following detailed description of the preferred embodiments.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 1A is an illustrative schematic diagram of a portion of a nanometer scale electromechanical system constructed in accordance with the present invention;

FIG. 1B is an illustrative schematic diagram of one embodiment of conversion circuitry constructed in accordance with the principles of the present invention;

FIG. 2 is an illustrative schematic diagram of a portion of another nanometer scale electromechanical system constructed in accordance with the principles of the present invention;

DETAILED DESCRIPTION OF THE INVENTION

Figure 3:
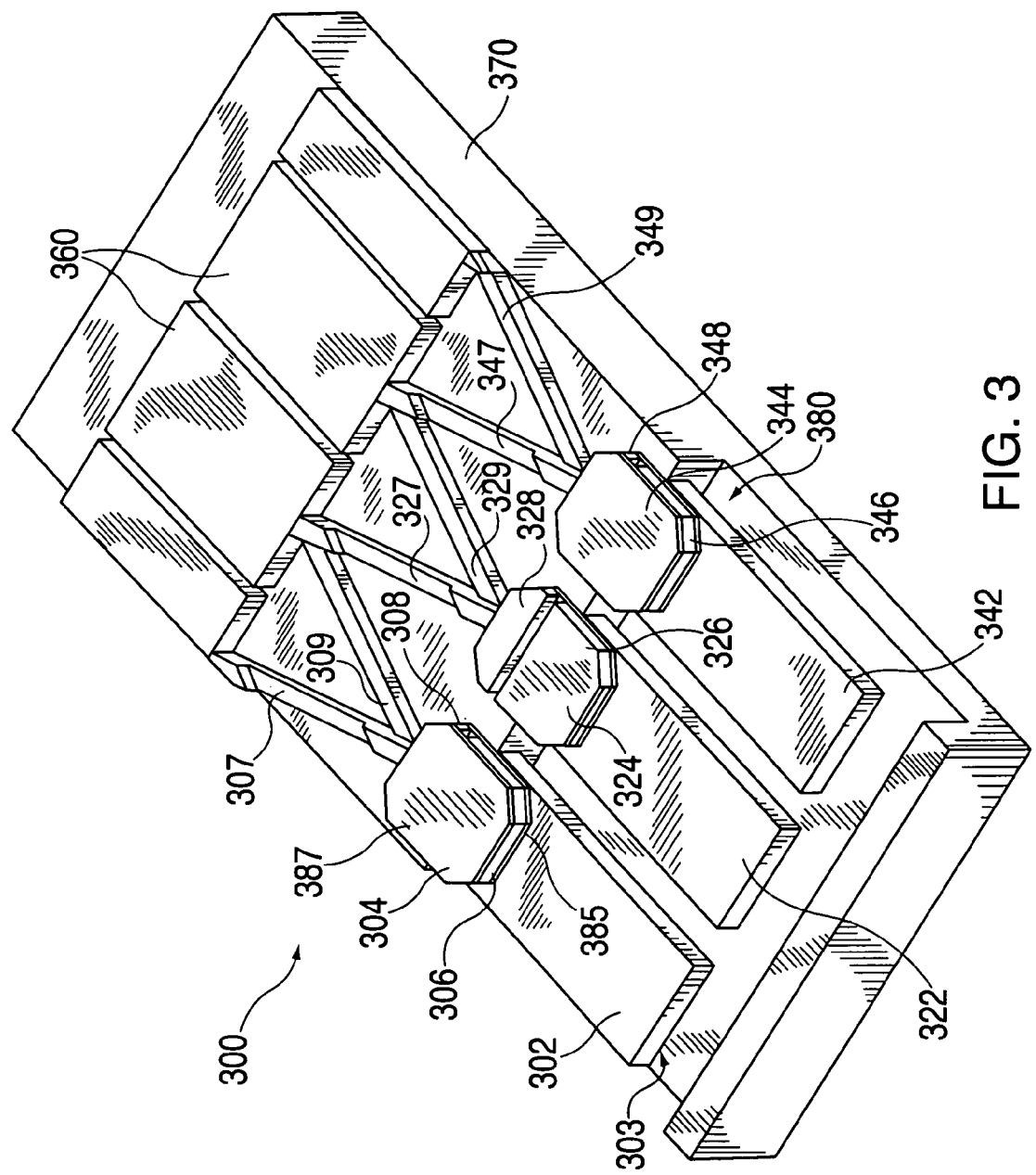
FIG. 3 is a perspective view of a portion of a nanometer scale electromechanical system constructed in accordance with the principles of the present invention.

FIG. 1A shows an illustrative example of a portion of a nanometer scale electromechanical system constructed in accordance with the present invention. The portion shown includes an impact mass in the form of paddle 100, a restraining member 102, an generator device 104 (which provides an electrical output at leads 106), and a base 108 (which is typically thousands or millions times larger than paddle 100). Paddle 100 is attached to base 108, which may be thermally conductive, but need not be, so that paddle 100 may be moved within a predetermined range of distance in one or more directions (such as laterally, or up and down). A complete energy conversion system using nanometer scale assemblies would typically include a million or more of the devices shown in FIG. 1A, as will become more apparent below (see, for example, FIGS. 5 and 6).

Paddle 100 may be constructed, for example, from a substance such as carbon or silicon, although persons skilled in the art will appreciate that variations may be made in the fabrication materials of paddle 100 without departing from the spirit of the present invention. Moreover, paddle 100 can generally be manufactured using known semiconductor fabrication techniques such as sputtering, etching, photolithography, etc.

In addition, each paddle 100 may be constructed to be about five nanometers on each side, and have a height of about one to two nanometers—this size being selected so that the effects of Brownian motion are large enough to overcome inertia of paddle 100 and the spring constant of restraining member 102. Persons skilled in the art will appreciate that the specific size of paddle 100 is not critical to the basic operation of the present invention, provided that paddle 100 is able to move in an irregular manner within the working substance as a result of random variations in the velocity of the working substance molecules that strike paddle 100.

Also shown in FIG. 1A, is molecule 110 which is shown as having bounced off of paddle 100, and is now traveling at a reduced velocity. Persons skilled in the art will appreciate that, while some molecules will have a reduced velocity as a result of the impact, others may exhibit little change in velocity, and others may actually achieve an increased velocity. In general however, and in accordance with the present invention, the impact of molecule 110 with paddle 100 results, on the average, with a reduction in velocity.

The molecule is a molecule of the working substance of the system, which is preferably a fluid (i.e., a gas or a liquid), but may also be a solid. The fluid may be kept at atmospheric pressure or it may be kept at an elevated pressure, such as, for example a pressure in excess of about 15 PSI. As described above, the pressure of the working fluid may have an impact in the output provided by the system. Molecule 110 strikes paddle 100, thereby causing molecule 110 to experience a reduction in velocity. The reduction in velocity corresponds to a reduction in temperature of the working substance of the system.

The reduction in velocity of molecule 110 is caused by paddle 100 in conjunction with device 104, which may be any one of a variety of devices without departing from the present invention. For example, device 104 may be a piezoelectric device, or it may be a electromotive force or electrostatic generator. In each instance, device 104 converts the energy of the impact mass, from the impact of molecule 110 into impact mass 100, into electrical energy that is output via leads 106.

The amount of electrical energy output via leads 106, even under the most favorable conditions will be very small. For example, the output of paddle 100 may be on the order of about $10^{-12}$ watts, depending on the size of the device and various other factors. Accordingly, for the system to provide useful output power, such as, for example, a few microwatts, the system requires that millions of such paddles be fabricated, and that they be connected together in some fashion, so that the outputs of all, or substantially all, of them can be summed into a single output signal.

If a million or so of paddles 100 were arranged together in an array (see, for example, FIGS. 5 and 6), one way to sum all of the energy from each of those paddles would be to couple the leads 106 of each paddle 100 to resistive element 112 (see FIG. 1B), and have resistive element 112 be in thermal contact with one side 114 of thermocouple 116. The other side 118 of thermocouple 116 would then be in thermal contact with a heat sink or some other substance at ambient temperature (which may even include the working substance itself). Thermocouple 116 is a thermoelectric generator that, in response to a temperature differential, produces a voltage across a pair of leads and, if the leads are connected to a load, a DC current.

Variations in molecular impacts on paddle 100 will cause an increase in the temperature of resistive element 112, which will then be converted into electrical energy by thermocouple 116 and output via leads 120. One advantage of the use of resistive elements is the fact that, because a resistive load is independent of current/polarity direction, there is no need for a rectifier associated with each paddle. Thus, in accordance with the present invention, even infinitesimal voltages produced by the impacts of molecules 110 on paddles 100 can be used to heat resistive elements to useful values. Each thermocouple in the array, in turn, produces an output having a DC voltage, and current if connected through an electrical load. All of these outputs can then be connected together in series to produce an output of at least several microwatts.

If additional power is needed, numerous subassemblies of paddles could be coupled together in series. For example, if a given subassembly was formed to include an array of paddle assemblies in which each assembly occupied approximately one hundred square nanometers, a square centimeter assembly would include roughly one trillion paddle assemblies. Then, any number of the one square centimeter subassemblies could be coupled together in series or parallel to achieve the desired ratio of voltage and current.

In addition, with a combined output on the order of approximately 700 mV, the output of each one square centimeter assembly could even be manipulated using conventional semiconductor switches. Thus, a given component could be fabricated by fabricating many one square centimeter assemblies next to each other on a thin, flexible sheet of material (such as aluminum) in a continuous process. The resultant sheets of material could then be cut up and rolled into a tube, similar to the fabrication process of some capacitors.

Persons skilled in the art will appreciate that the electrical output of these devices per unit surface area is proportional to the pressure of the fluid, the average temperature of the fluid, the oscillation frequency of the paddle and the mass of the fluid molecules used (regardless of whether the fluid is a gas or a liquid). The output per unit area is inversely proportional to the size of the paddle and the density of the paddle material. Accordingly, by choosing a heavy molecule gas, such as xenon, or by using a fluid heavily laden with particulate, such as air laden with carbon molecules, and/or by immersing the paddles in the gas at elevated pressure, such as 100 times atmospheric pressure, the power output of the units can be increased by a factor of over 100, as compared with units operating in air at atmospheric pressure.

FIG. 2 shows a alternate embodiment of the paddle assembly shown in FIG. 1. In particular, the assembly in FIG. 2 varies from that in FIG. 1 in that restraining member 102 is coupled to a housing 208 instead of base 108. Housing 208 is a thermally conductive chamber which includes the ability to receive thermal inputs (shown as "Q" in FIG. 2). In this embodiment, the influx of heat Q is converted into electrical energy that is output via each of leads 106. In addition, while the assembly shown in FIG. 1 does not include a housing, it may be desirable, but is certainly not required, to locate that assembly in a housing as well, if only to protect it from contaminates.

The embodiment shown in FIG. 2 may be used to illustrate one of the advantages of the present invention, in that the nanometer scale energy conversion systems of the present invention may be used as a heat pump. For example, thermally conductive housing 208 will be cooled as a result of the molecular impacts on paddles 100 and subsequent conversion of the paddle kinetic energy into electrical energy. Warm or hot air may be cooled by blowing it across housing 208. On the other hand, resistive load 112 may be connected in series with leads 106, which results in the temperature of resistive load 112 being raised. Cool air may be warmed by blowing it over resistive load 112. In this manner, the same assembly may be used to heat an external substance or to cool an external substance.

FIG. 3 shows another embodiment of a portion of a nanometer scale electromechanical system 300 constructed in accordance with the principles of the present invention. The portion of system 300 shown in FIG. 3 includes three paddle assemblies 302, 322 and 342, which are each coupled to one of piezoelectric generators 304, 324 and 344. Each of paddle assemblies 302, 322 and 342 is somewhat similar to paddle assembly 100 of FIG. 1, in that each paddle assembly shown in FIG. 3 also includes a substantially planar surface that is held in place such that it may move in response to molecular impacts. In this instance, paddle assemblies 302, 322 and 342 are attached at one end which is generally referred to by numeral 380 in FIG. 3.

The piezoelectric generators are each formed from a portion of piezoelectric material and a resistor assembly. Generator 324, for example, which is substantially similar to generators 304 and 344, is illustrated to show the division between piezoelectric material 326 and resistor assembly 328. However, the division between the piezoelectric portion and the resistor assembly may also be observed in FIG. 3 for generators 304 and 344.

Resistor assemblies 308, 328 and 348 are each connected to two wires that are made from different material. For example, each of wires 307, 327 and 347 are made from one material, while wires 309, 329 and 349 are all made from a different material. The other end of all of the wires are connected to a series of heat sinks 360, which are themselves mechanically coupled to a substrate 370 (which may, for example, be a silicon substrate). It should be noted that paddle assemblies 302, 322 and 342 are only connected to substrate 370 at one end, generally referred to by reference number 380, so that, for example, the paddle assemblies may easily vibrate up and down.

System 300 operates in accordance with the present invention as follows. The entire system is immersed in a fluid (i.e., a liquid or a gas) that is the working substance. Statistical variations in the velocity of working substance molecules that strike paddle 302, for example, cause the free end of paddle 302 to vibrate up and down. The up and down motion of paddle 302 causes strain in piezoelectric material 306, which generates a voltage between lower conductive outer layer 385 and upper conductive layer 387 of material 306.

Outer conductive layers 385 and 387 of material 306 are in contact with resistor assembly 308, so that a current flows from material 306 through resistor 308 and back to material 306. The current through resistor 308 heats up the resistor, which is coupled to one side of the thermoelectric generator formed by wires 307 and 309 (which, as described above, are made from different materials). The other side of the thermoelectric generator (which may also be referred to as a thermocouple) is coupled to heat sinks 360, which are at a lower temperature. Persons skilled in the art will appreciate that other devices may be used, such as thermal to electric heat engines (such as, for example, a thermionic heat engine), rather than thermoelectric generators described herein, without departing from the spirit of the present invention.

The temperature differential causes the thermoelectric generator to produce a voltage, which, as described more fully below, may be combined with the voltages from other paddle assemblies to provide a system output voltage. These voltages, in accordance with the present invention, may be coupled together in series to produce an electrical output at a useable level from system 300. The process of summing voltages from each paddle assembly is more particularly illustrated with respect to FIGS. 5 and 6 below.

Persons skilled in the art will appreciate that, while system 300 has been described as a system that converts kinetic energy of the impact mass (resulting from the Brownian motion of the impact mass immersed in a working substance) to AC electrical energy to thermal energy and to DC electrical energy, system 300 may, with minor changes, directly produce DC electric energy as a result of this kinetic energy.

In particular, it should be noted that movement of paddle 302 upward and then downward to its resting location generates a voltage of one polarity. Movement downward and then upward back to the resting location generates a voltage in the opposite polarity. Thus, in accordance with the present invention, paddles 302 can be substantially limited to moving between a neutral point (i.e., the resting location) and a single limit point (versus normal vibration that goes from a first limit point, through the neutral point to a second limit point and back).

Accordingly, if paddle 302 were limited to "upward" movement by placing an object at location 303 (i.e., toward the free end of paddle 302), the output voltage would be limited to one polarity (essentially, pulsating DC). In such a configuration, the outputs of the piezoelectric generators (such as generator 304) could be directly coupled together in series, which would eliminate the need of, for example, resistor assembly 308, wires 307 and 309 and heat sinks 360, while still providing useful levels of electrical power without the need for rectification circuitry.

Figure 4:
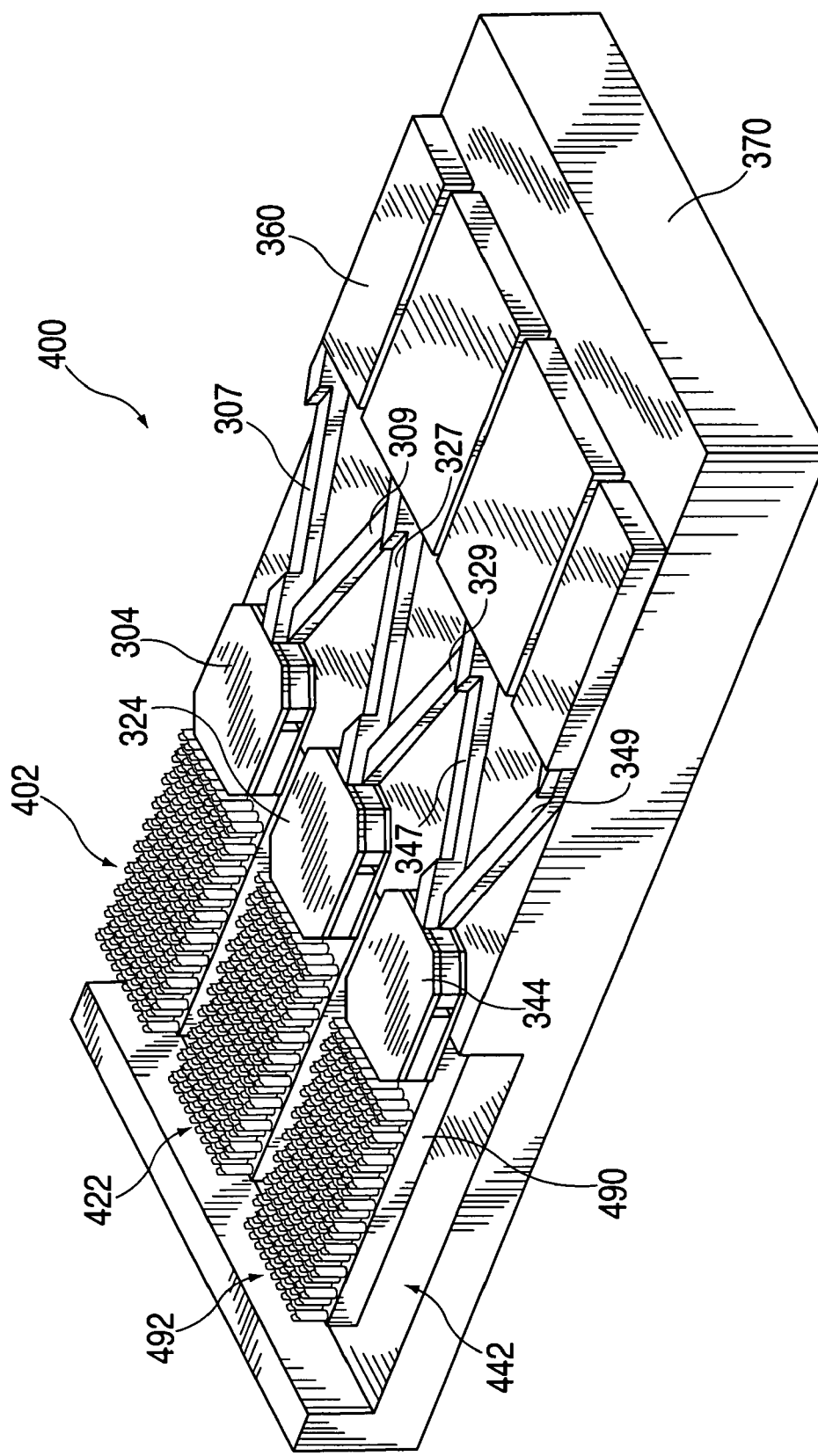
FIG. 4 is a perspective view of a portion of another nanometer scale electromechanical system constructed in accordance with the principles of the present invention.

FIG. 4 shows another embodiment of a portion of a nanometer scale electromechanical system 400 constructed in accordance with the principles of the present invention. The portion of system 400 shown in FIG. 4 includes three paddle assemblies 402, 422 and 442, which are each coupled to one of piezoelectric generators 304, 324 and 344 (which were described above with respect to FIG. 3).

As shown in FIG. 4, each of the paddle assemblies 402, 422 and 442 includes an impact mass 490 and a multitude of nanotubes 492 that are mounted on impact mass 490 such that they are substantially perpendicular to impact mass 490. Each of nanotubes 492 may, for example, be constructed of a material such as carbon, having a diameter of about approximately 2 nanometers and a height of about approximately 25–50 nanometers (persons skilled in the art will appreciate that the dimensions of nanotubes 492 may be varied without departing from the spirit of the present invention). Moreover, the stiffness and alignment of nanotubes 492 may be controlled by the application of a static voltage, such as that shown in FIG. 7, and described below.

System 400 operates in very much the same way as previously described for system 300. Statistical variation in gas pressure about paddles 402, 422 and 442 cause the free end of paddle 402 to vibrate up and down, thereby causing strain in the piezoelectric material, which generates a voltage on the conductive outer layers of the piezoelectric material. In system 400, however, the up and down motion of the paddles in system 400 may be enhanced by nanotubes 492, which cause additional molecular impacts.

The outer conductive layers of the piezoelectric material are in contact with resistor assembly, so that a current flows, which heats up the resistor. The thermoelectric generator formed, for example, by wires 307 and 309 is between the heated resistor and the heat sinks 360, which are at a lower temperature. The temperature differential causes the thermoelectric generator to produce a voltage.

Figure 5:
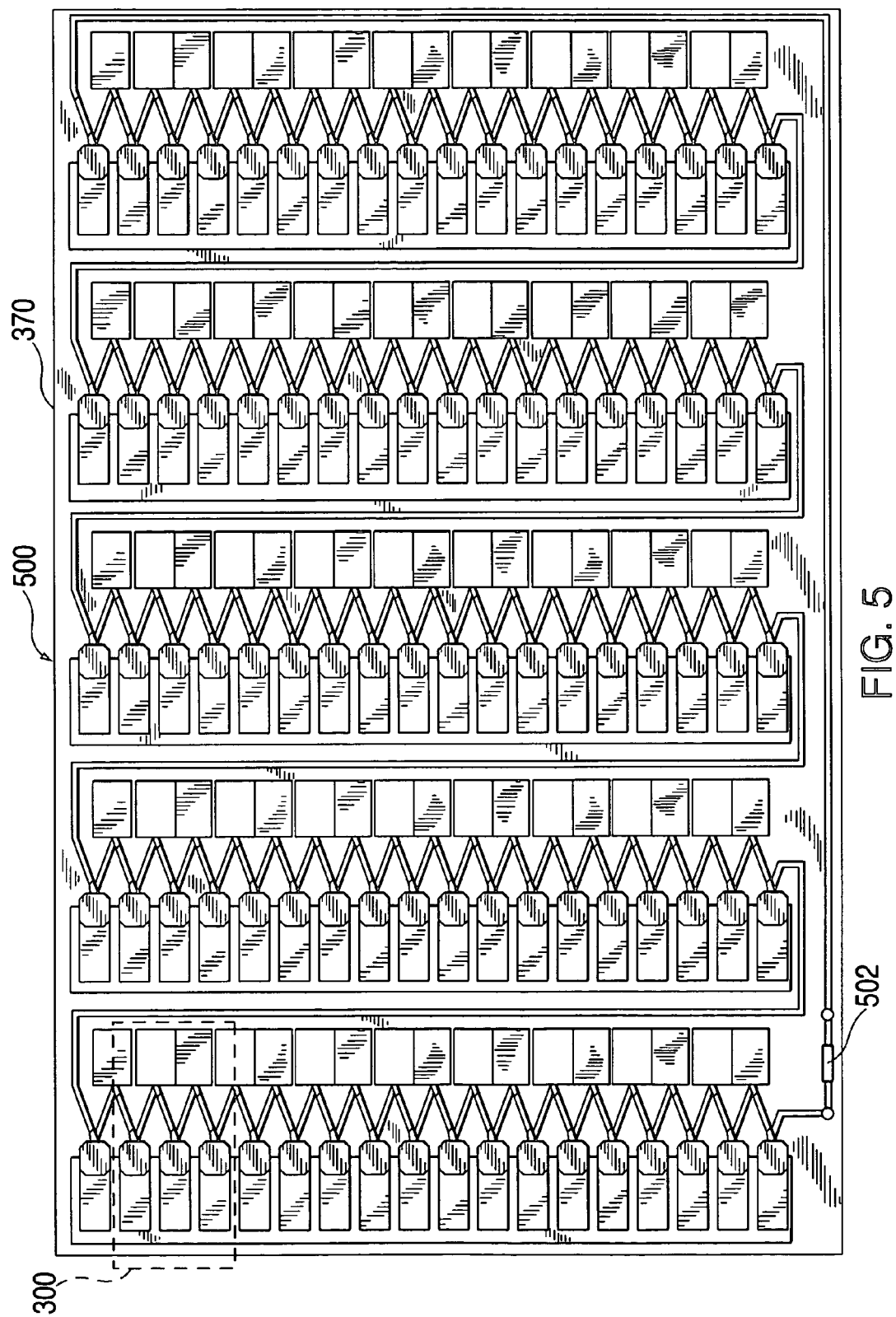
FIG. 5 is an illustrative schematic diagram of a nanometer scale electromechanical system constructed in accordance with the principles of the present invention.
Figure 6:
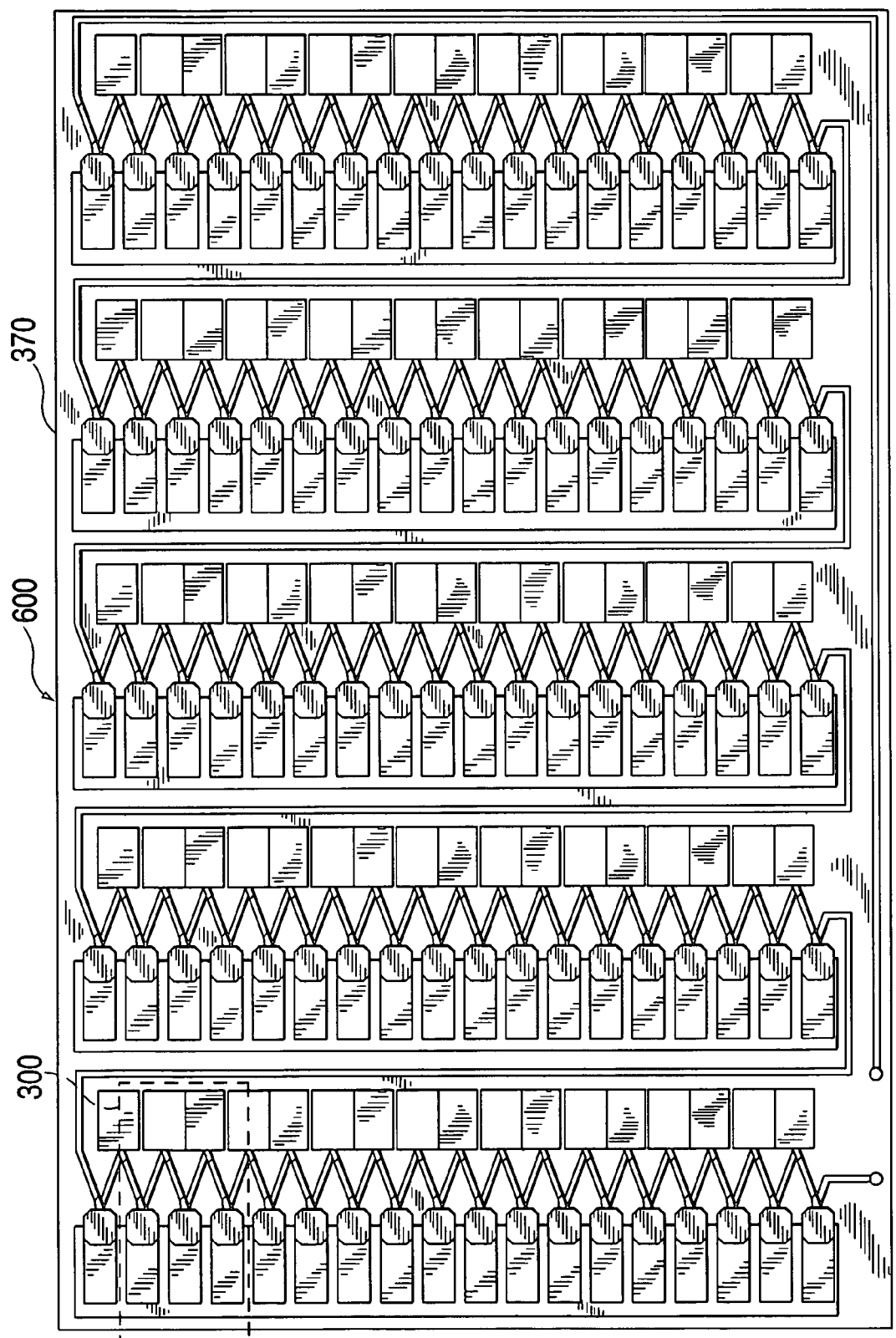
FIG. 6 is an illustrative schematic diagram of another nanometer scale electromechanical system constructed in accordance with the principles of the present invention.

FIGS. 5 and 6 show two similar configurations of nanometer scale electromechanical systems 500 and 600, respectively, that are each constructed in accordance with the principles of the present invention. Systems 500 and 600 each include a multitude of paddle assemblies 302, coupled to generators 304 which are themselves, coupled to wires 307 and 309 that are connected to heat sinks 360. This may be more apparent by viewing the dashed box showing where the portion of system 300 of FIG. 3, for example, may be found. As shown in FIGS. 5 and 6, systems 500 and 600 each include ninety paddle assemblies 302 and the associated components (i.e., generators, wires and heat sinks).

In practice, nanometer scale electromechanical systems constructed accordance with the present invention may include a billion or more paddle assemblies on a single substrate. The output voltage across each pair of wires extending from each thermoelectric generator on a single substrate are, in accordance with the present invention, coupled together in series to provide a single output signal for the system. That output signal may have a voltage that may be on the order of a volt, depending on the number of individual components used and the specific fabrication techniques used to manufacture those components. The primary difference between systems 500 and 600, is that system 500 includes a load resistor 502 while system 600 does not.

Persons skilled in the art will appreciate that, while load resistor 502 is shown as being mounted to substrate 370, it may be preferable to thermally isolate load resistor from the working fluid substrate 370 is immersed in so that heat dissipated by load resistor 502 does not affect the temperature of the working fluid.

Figure 7:
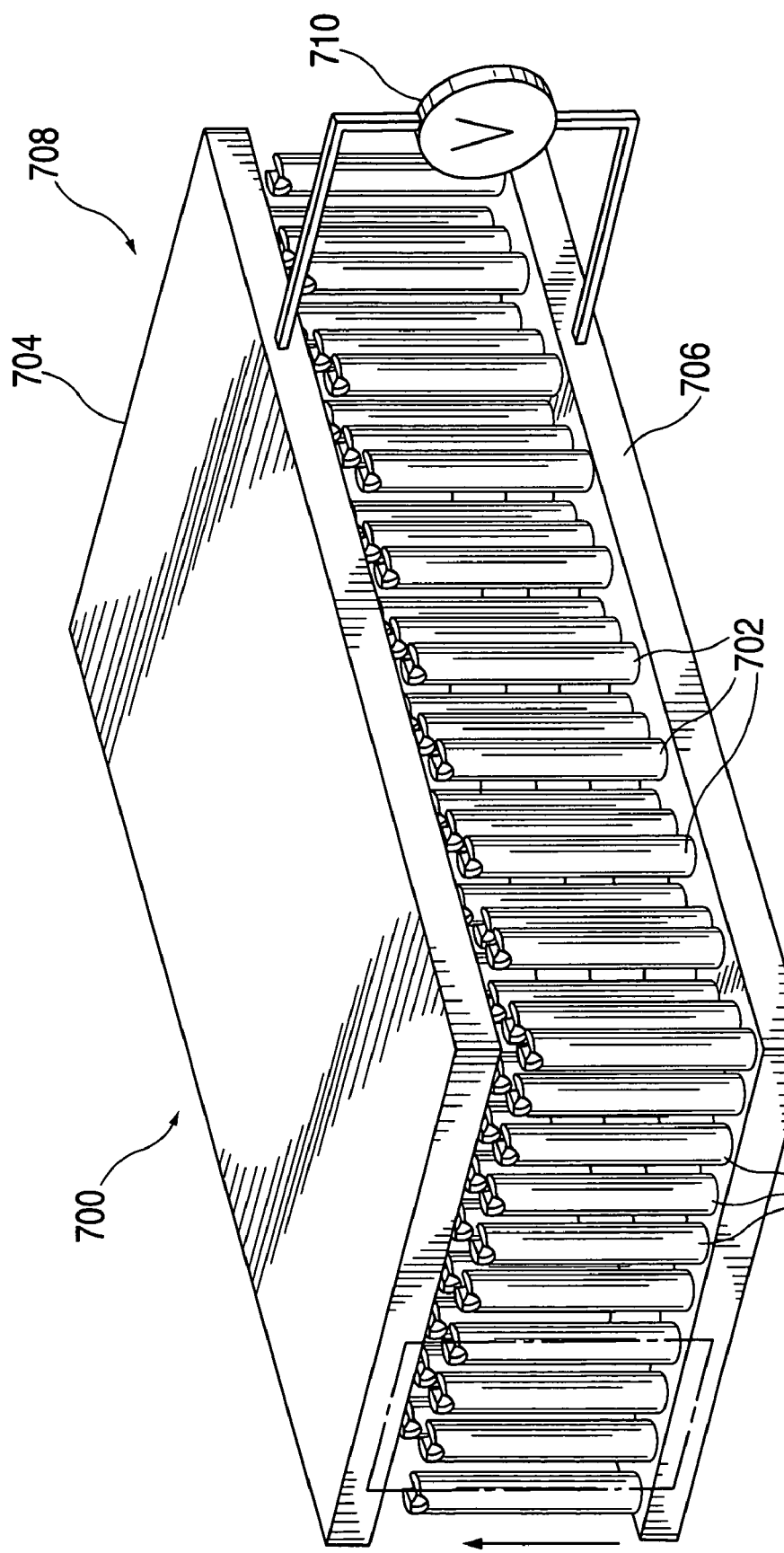
FIG. 7 is a perspective view of another nanometer scale electromechanical system constructed in accordance with the principles of the present invention.

FIG. 7 shows another embodiment of a nanometer scale electromechanical system 700 constructed in accordance with the principles of the present invention. System 700 includes an array of nanotubes 702 located between an upper plate 704 and lower plate 706 of capacitor 708, and a source of voltage 710, which is also coupled across the plates of capacitor 708. Each of nanotubes 702 may, for example, be constructed of a material such as carbon, having a diameter of about approximately 2 nanometers and a height of about approximately 25–50 nanometers (persons skilled in the art will appreciate that the dimensions of nanotubes 702 may be varied without departing from the spirit of the present invention).

One end of each nanotube 702 is fixed to lower plate 706 of capacitor 708. The other end of each nanotube 702 is free to move. The entire assembly 700 is then typically immersed in a fluid (i.e., gas or liquid). Once a voltage V is applied from source 710 across the plates of capacitor 708, an electric field E is produced that creates a force that helps keep the length of nanotubes 702 oriented substantially perpendicular with the surface of capacitor plates 704 and 706. Statistical variations in the speed and direction of working fluid molecules which strike nanotubes 702 cause statistical variations in fluid pressure about nanotubes 702 which, in turn, cause nanotubes 702 to move erratically as illustrated in FIGS. 8 and 9.

Figure 8:
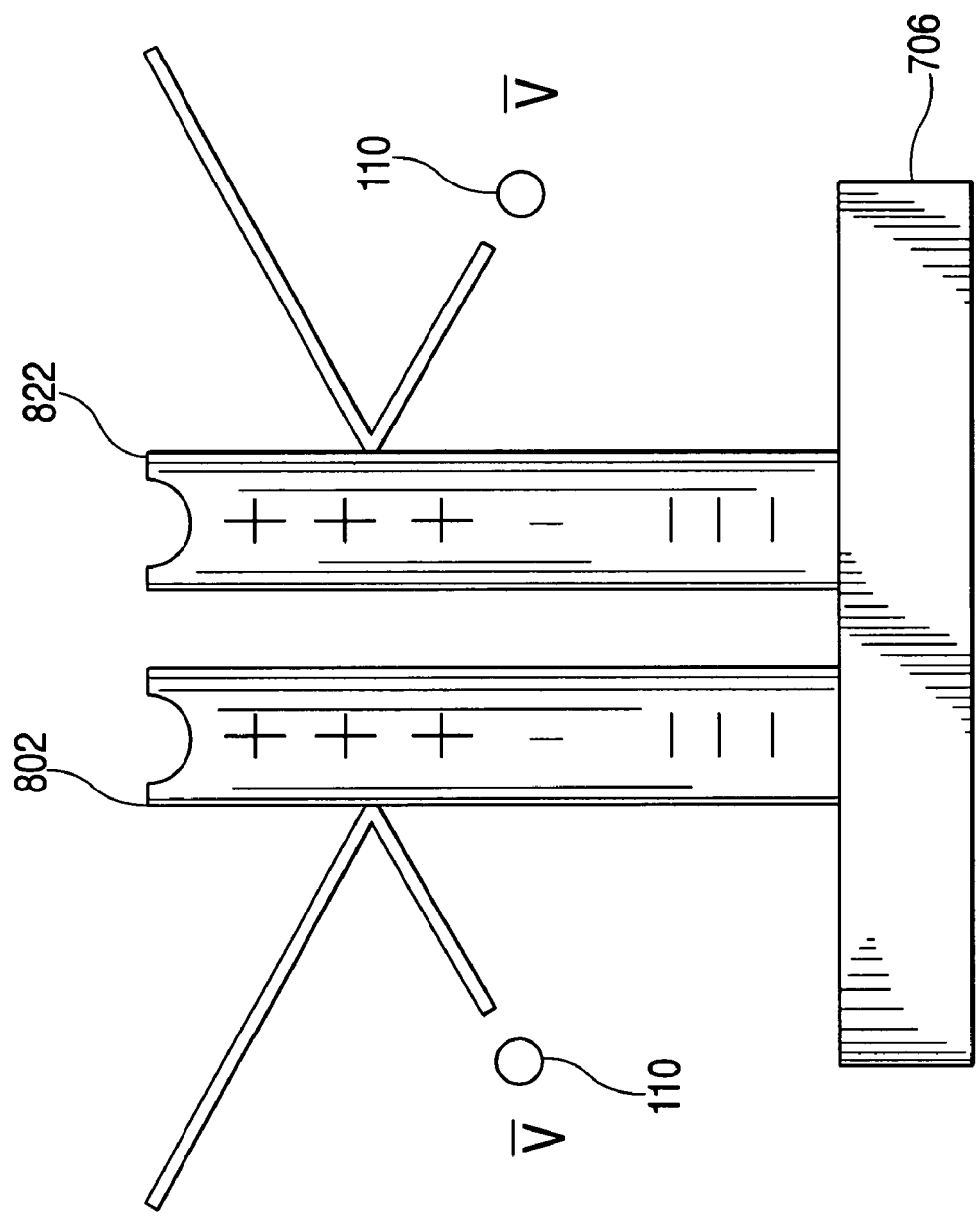
FIG. 8 is an illustrative schematic diagram of a portion of the nanometer scale electromechanical system of FIG. 7.

As shown in FIG. 8, nanotubes 802 and 822 (which are simply any two adjacent nanotubes 702) are substantially perpendicular to lower capacitor plate 706 even though individual molecules 110 have recently impacted each nanotube. In this instance, there is no variation in the gas pressure on either side of the nanotubes, and the tubes remain erect. Persons skilled in the art will appreciate that, while the interaction of two nanotubes is shown, the molecular impact of thousands or millions of nanotubes would be occurring simultaneously.

Figure 9:
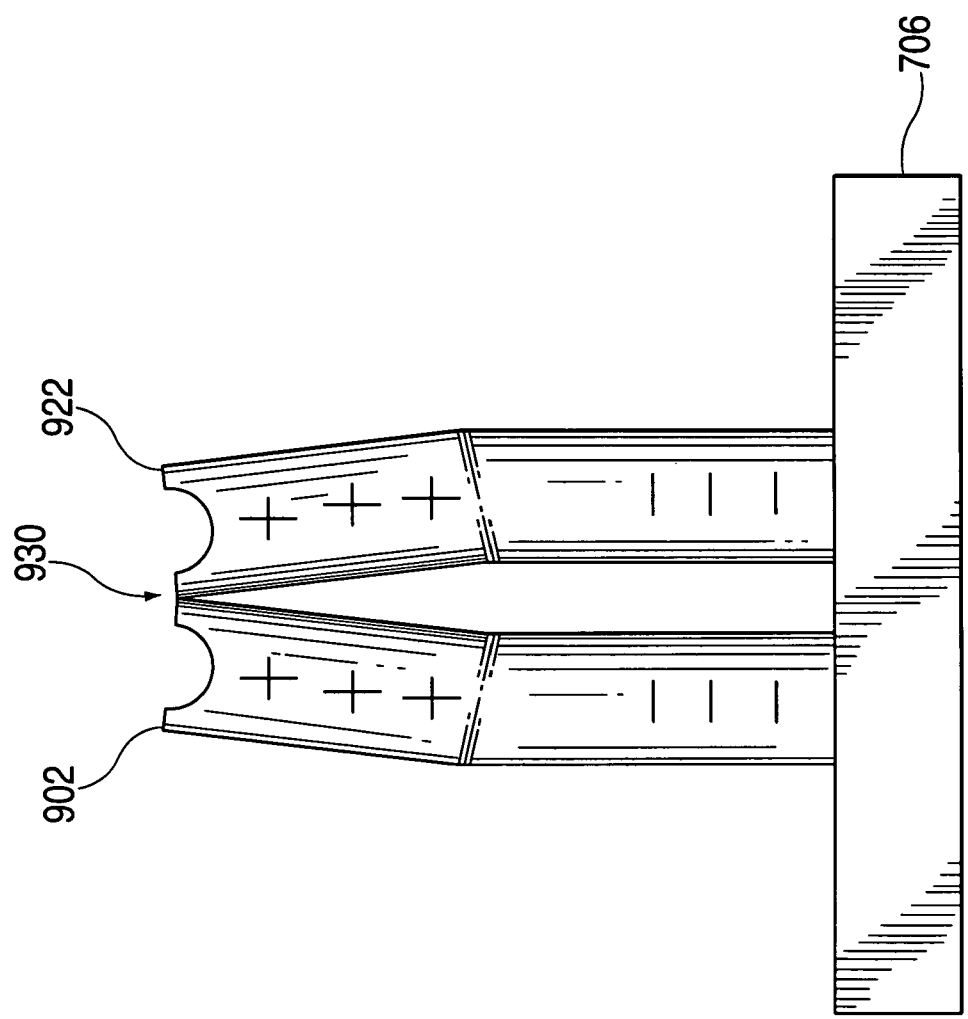
FIG. 9 is another illustrative schematic diagram of a portion of the nanometer scale electromechanical system of FIG. 7.

FIG. 9, on the other hand, illustrates the effect of statistical variation in fluid pressure about nanotubes 902 and 922 (which, like nanotubes 802 and 822, are simply two adjacent nanotubes 702) resulting from variations in the thermal movement of working fluid molecules, which cause the free ends of nanotubes 902 and 922 to collide at location 930. The kinetic energy of colliding nanotubes 902 and 922 is partially converted into thermal energy as a result of the friction from contact and as the tubes slide past each other. The thermal energy is conducted down the length of nanotubes 902 and 922 to thermally conductive plate 706.

In addition, as illustrated in FIGS. 8 and 9, each of nanotubes 702 (or nanotubes 802, 822, 902 and 922) has an electrostatic charge due to the electric field E between capacitor plates 704 and 706. The collision of nanotubes 902 and 922 further dissipates tube kinetic energy by accelerating electrical charges, which in turn produces electromagnetic waves, at the free end of the nanotubes. In this manner, a portion of the kinetic energy of the working fluid is transferred to lower capacitor plate 706, and to the surrounding space, as electromagnetic energy resulting in a net effect of cooling the working substance and heating lower capacitor plate 706. This temperature differential may then be used to directly heat or cool an area of space or to power a heat engine.

Figure 10:
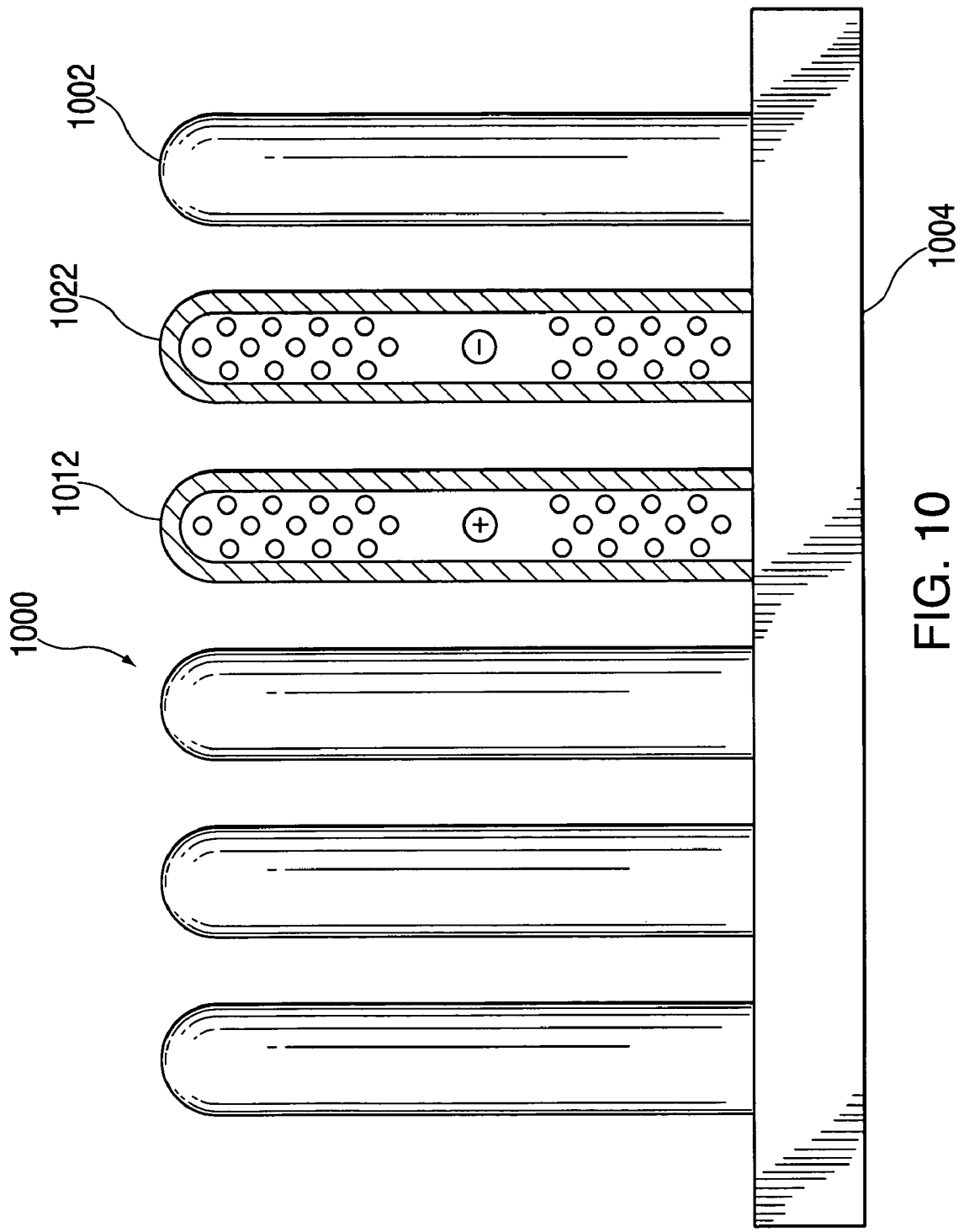
FIG. 10 is a cross-sectional view of another nanometer scale electromechanical system constructed in accordance with the principles of the present invention.

FIG. 10 shows another embodiment of a nanometer scale electromechanical assembly 1000 constructed in accordance with the present invention. Assembly 1000 includes many nanotubes 1002, all connected to a base 1004. Unlike the previous embodiments, nanotubes 1002 are closed at their upper end such that gas molecules are captured within each nanotube 1002. In addition, as shown in FIG. 10, at least one molecule in each nanotube 1002 is electrically charged (for example, individual nanotube 1012 includes at least one positively charged molecule, while individual nanotube 1022 includes at least one negatively charged molecule).

Assembly 1000 is configured such that the net charge of nanotubes 1002 in the assembly is zero, with half of the tubes including positive charges and the other half including negative charges. In this embodiment, as the charged molecules bounce against the nanotube walls and the other molecules within the nanotubes, an acceleration of charge results that generates electromagnetic waves which pass through the tube assembly to the surrounding space. As a result of the electromagnetic radiation, gas within nanotubes 1002 cools, which cools thermally conductive base 1004. In this instance, the reduced temperature of base 1004 may be utilized to cool a volume of fluid, or can be used as the "cold side" of a heat engine, as will be apparent to persons skilled in the art.

Figure 11:
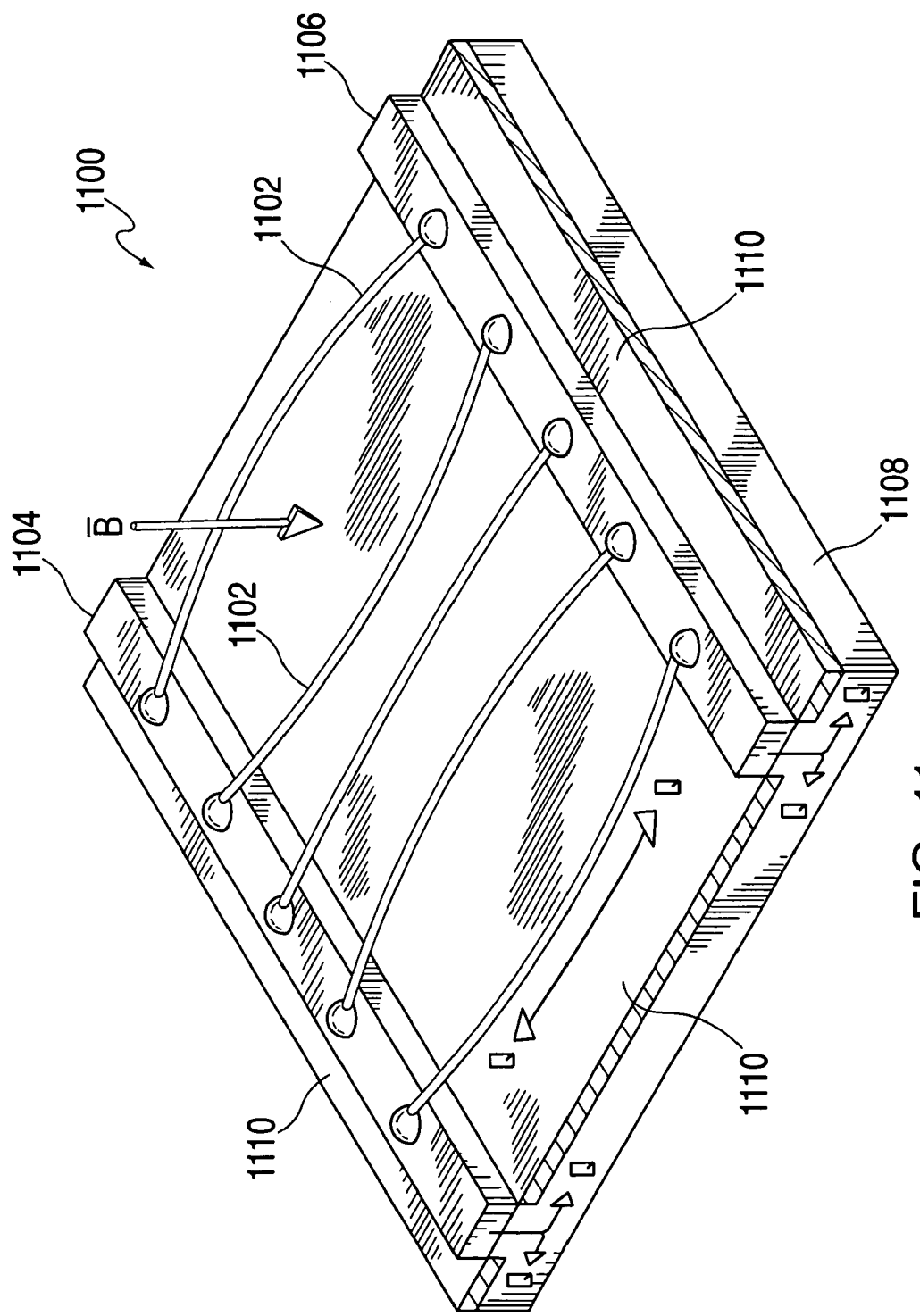
FIG. 11 is a perspective, partial cross-sectional view of another nanometer scale electromechanical system constructed in accordance with the principles of the present invention.

FIG. 11 shows a nanometer scale electromechanical assembly 1100 constructed in accordance with the principles of the present invention. Assembly 1100 includes a series of nanometer members 1102 that are connected between a pair of electrically and thermally conductive rails 1104 and 1106. In this embodiment, nanometer members 1102 are carbon nanotubes and each one of nanotubes 1102 is provided with some slack, which enables the nanotubes to vibrate in reaction to random pressure variations in the surrounding working substance. Rails 1104 and 1106 are mounted to and in thermal contact with thermally conductive base 1108.

It should be noted that various other nanometer members may be used in accordance with the present invention instead of the nanotubes described herein. For example, the principles of the present invention may be carried out using essentially any electrically conductive material that may be formed into very small fibers. This may include simple carbon fibers instead of nanotubes.

Figure 12:
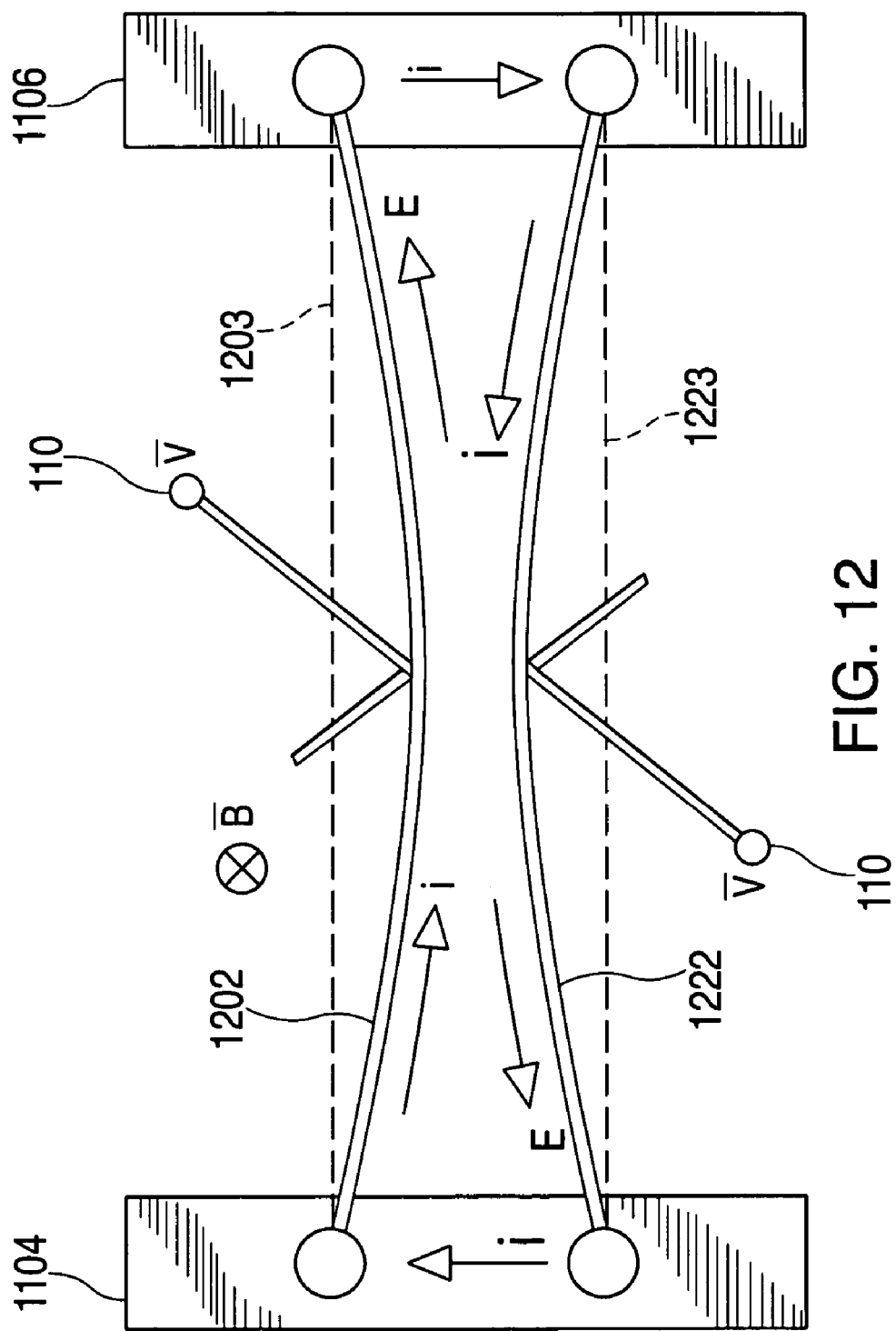
FIG. 12 is an illustrative schematic diagram of a portion of the nanometer scale electromechanical system of FIG. 11.

The nanometer members shown in FIGS. 11 and 12 (as well as those of FIGS. 13–16 discussed below) perform additional functions when compared to, for example, the previously described paddles. For example, the nanometer members of FIGS. 11–16 all function as the impact mass while contributing to the functions of the previously described restraining member and generator device. In addition, the nanometer members of FIGS. 11 and 12 also function as the resistive element (FIGS. 13–16 include resistive element 1304, as described more fully below).

Attached to thermally conductive base 1108, in accordance with the principles of the present invention, is a thermal insulation material 1110 that covers at least a majority of the otherwise exposed portions of conductive base 1108. The use of insulation 1110 aides in the prevention of thermal energy losses. Moreover, persons skilled in the art will appreciate that similar insulation may be utilized in the previously described embodiments to further increase the efficiency of those systems and assemblies.

An external magnetic field (shown as "$\overline{B}$" in FIG. 11) penetrates assembly 1100 which is perpendicular to rails 1104 and 1106 and base 1108. The operation of assembly 1100 is illustrated in FIG. 12, which shows a portion of rails 1104 and 1106, and includes two individual nanotubes 1202 and 1222 (which are simply two adjacent nanotubes 1102). Nanotubes 1202 and 1222, which are immersed in a working substance, move in an irregular manner from the relaxed "rest" position (shown as straight dotted lines 1203 and 1223) due to random variations in the thermal motion of the molecules of the working substance. Motion of nanotubes 1202 and 1222 in the presence of the magnetic field $\otimes \overline{B}$ induces an electric field E along the length of nanotubes 1202 and 1222 (as shown in FIG. 12).

Field E induces current "i" to flow that flows from one nanotube, down one rail, across the other nanotube, and up the other rail (which, while illustrated as a clockwise current, may be counterclockwise at some other point in time when the direction of the motion of the nanotubes changes, thereby producing AC current). The current flow through the nanotubes and rails causes resistive heating and causes heat to travel along the nanotubes and rails to conductive base 1108. Fluid (either gas or liquid) surrounding the nanotubes cools while base 1108 heats up, thereby establishing a temperature differential that may be used in a variety of ways (such as the heat pump, or heat engine previously described).

FIGS. 13–16 show a further illustration of the use of insulation in accordance with the principles of the present invention in assembly 1300. Assembly 1300 is similar to assembly 1100 of FIG. 11 in many aspects. Assembly 1300 also includes nanotubes 1302 that are immersed in a working substance. Moreover, as described above with respect to nanotubes 1102, nanotubes 1302 are installed with slack such that they can move in an irregular manner due to random fluctuations in the thermal motion of the molecules of the working substance.

Assembly 1300 also relies on an external magnetic field $\overline{B}$. As previously described, motion of nanotubes 1302 through the magnetic field $\overline{B}$ induces an AC current to flow, which in this case, is directed through a resistor 1304 located directly below each of nanotubes 1302. The value of resistor 1304 may be chosen to be about twice the resistance of the nanotube, in which case the majority of power generated is dissipated as heat through the resistor.

Assembly 1300 is configured such that the resistors 1304 are located below insulating layer 1310 and above thermally conductive sheet 1312. This results in directing most of the generated power and heat downward into assembly 1300, rather than up into the working fluid. Moreover, rather than using rails, assembly 1300 utilizes posts 1306, so that only a limited amount of surface area that is at an elevated temperature is exposed to the working fluid. Resistors 1304, posts 1306 and the resistor leads are electrically insulated from thermally conductive sheet 1312 by a thin layer of electrical insulation 1314 that is deposited on top of conductive layer 1312.

Heat from resistor 1304 raises the temperature of thermally conductive sheet 1312. The bottom of conductive sheet 1312 is in thermal contact with a "HOT" portion 1330 of a thermoelectric generator 1334 (sheet 1312 is electrically insulated from hot portion 1330 via electrically insulating sheet 1316). A second thermally conductive sheet 1322 is in thermal contact with a "COLD" portion 1332 of a thermoelectric generator 1334 (while the two are electrically insulated by thin layer 1318). In this manner, generated heat is directed from resistors 1304 downward through assembly 1300 and out the bottom of lower layer 1322.

Temperature differentials between the HOT and COLD portions (1330 and 1332, respectively) of thermoelectric generator 1334 create a DC voltage across each junction. By interconnecting a multitude of these junctions together in series, assembly 1300 may be used to provide a useable voltage which may be about at least 1 volt, as was previously described for the other embodiments. When assembly 1300 is used to drive a load, such that the load is connected in series to thermoelectric generator 1334, and the working fluid is being cooled or maintained within a predetermined temperature range, improved efficiency of the system will be obtained by keeping the load away from the working fluid so that dissipated power in the load does not affect the temperature of the working fluid.

Figure 15:
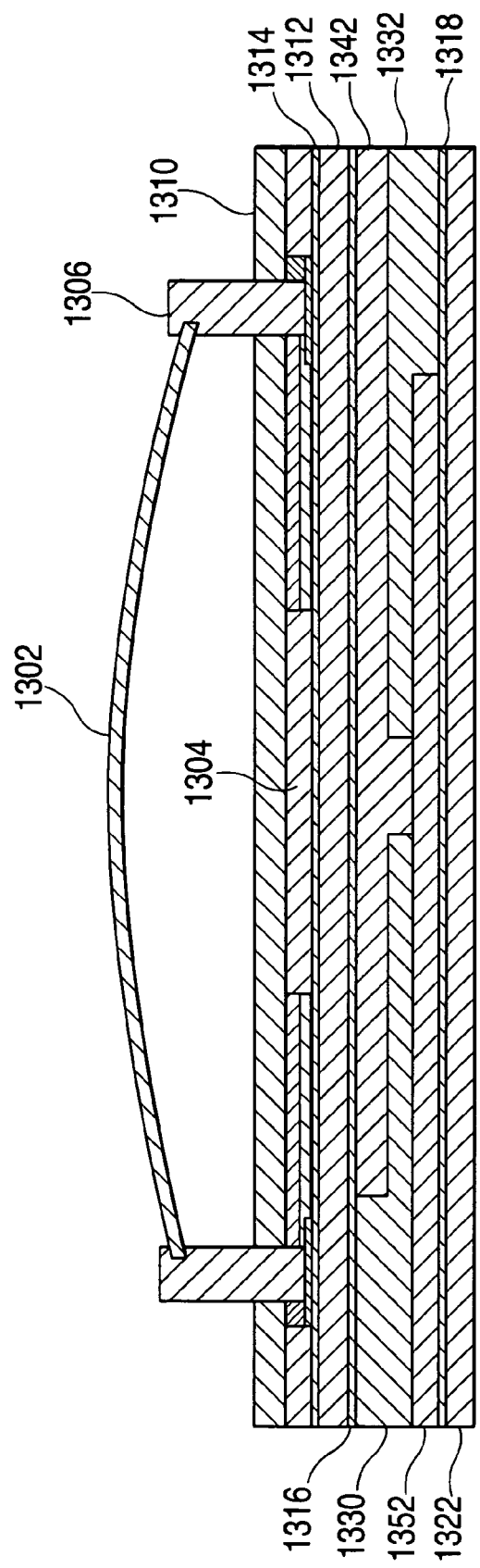
FIG. 15 is a cross-sectional plan view of the nanometer scale electromechanical system of FIG. 13 taken along line 14—14.

Moreover, as can be viewed most clearly in FIG. 15, additional layers of thermal insulation are used to separate the HOT portions of assembly 1300 from the COLD portions of assembly 1300. In particular, assembly 1300 also includes insulating layer 1342 sandwiched between conductive sheet 1312 (actually, as shown, layer 1342 is below electrical insulating layer 1316) and COLD portion 1332. Insulating layer 1352, on the other hand, is located between a second conductive sheet 1322 and HOT portion 1330 (actually, as shown, layer 1352 is underneath electrically insulating layer 1318). These insulating layers increase the temperature difference between HOT and COLD portions of thermoelectric generator, thus increasing the electrical output of thermoelectric generator 1334.

Figure 16:
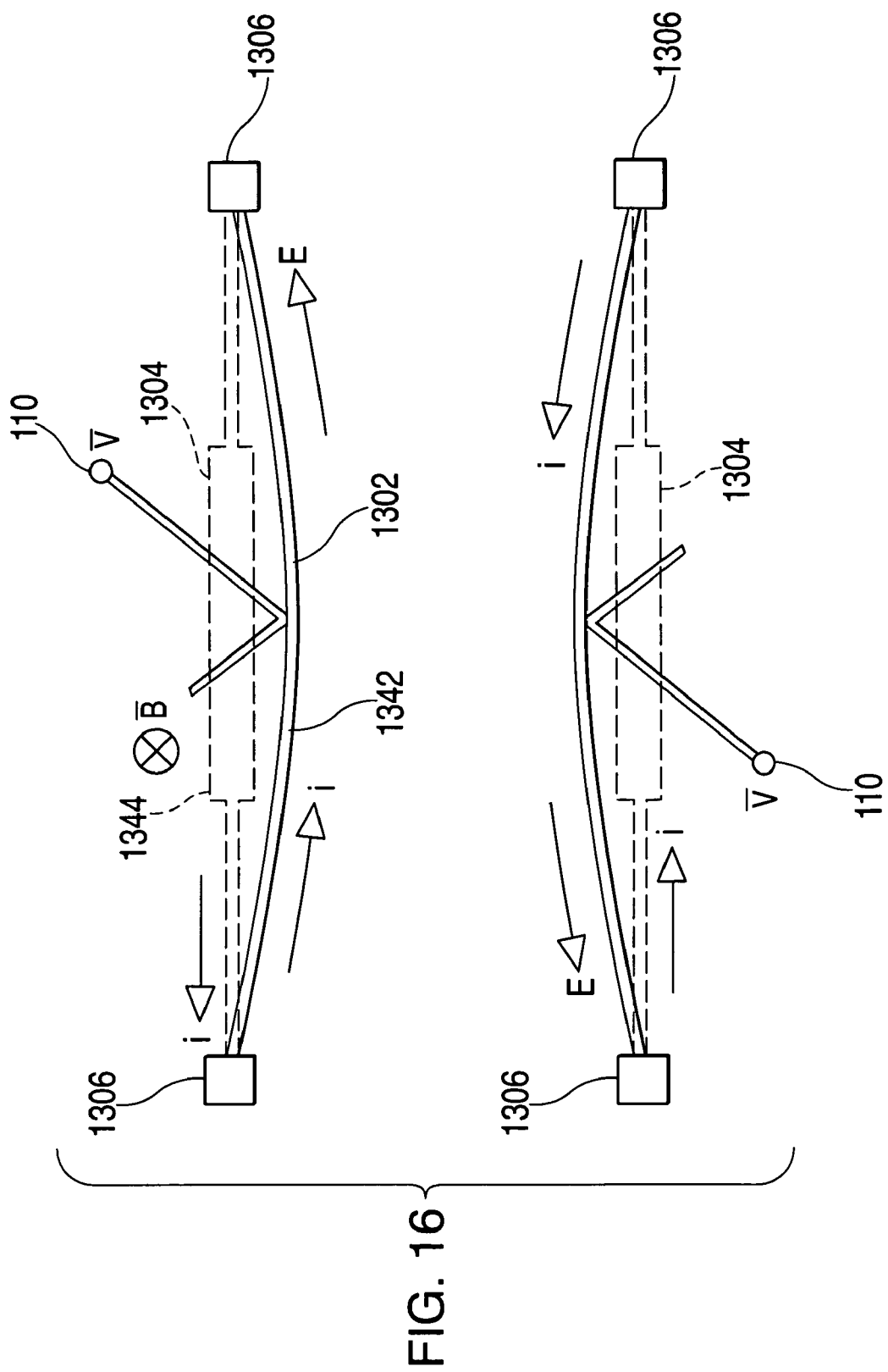
FIG. 16 is an illustrative schematic diagram of a portion of the nanometer scale electromechanical system of FIG. 13.

Operation of assembly 1300 is similar to assembly 1100, and is illustrated with respect to FIG. 16. Movement of nanotubes 1302 in the external magnetic field $\vec{x} \vec{B}$ induces a current "i" to flow as shown in FIG. 16. In this case, though, the current from each individual nanotube 1302 remains in a self-contained circuit, along with the corresponding resistor 1304. For example, the current induced in individual nanotube 1342 remains in an "isolated" circuit with individual resistor 1344, rather than interacting with an adjacent nanotube, as was described with respect to assembly 1100. Once again, persons skilled in the art will appreciate that, while the movement of two nanotubes is shown, the movement of millions or billions of nanotubes would be occurring simultaneously.

Persons skilled in the art should appreciate that, while it may appear that an individual thermoelectric generator portion is available for each individual nanotube 1302, is will likely be impractical and or prohibitively expensive to implement such a configuration. Thus, it may be more likely that, in accordance with the present invention, several, if not millions, of nanotubes 1302 will be thermally coupled to each individual portion of thermoelectric generator 1334.

Figure 17:
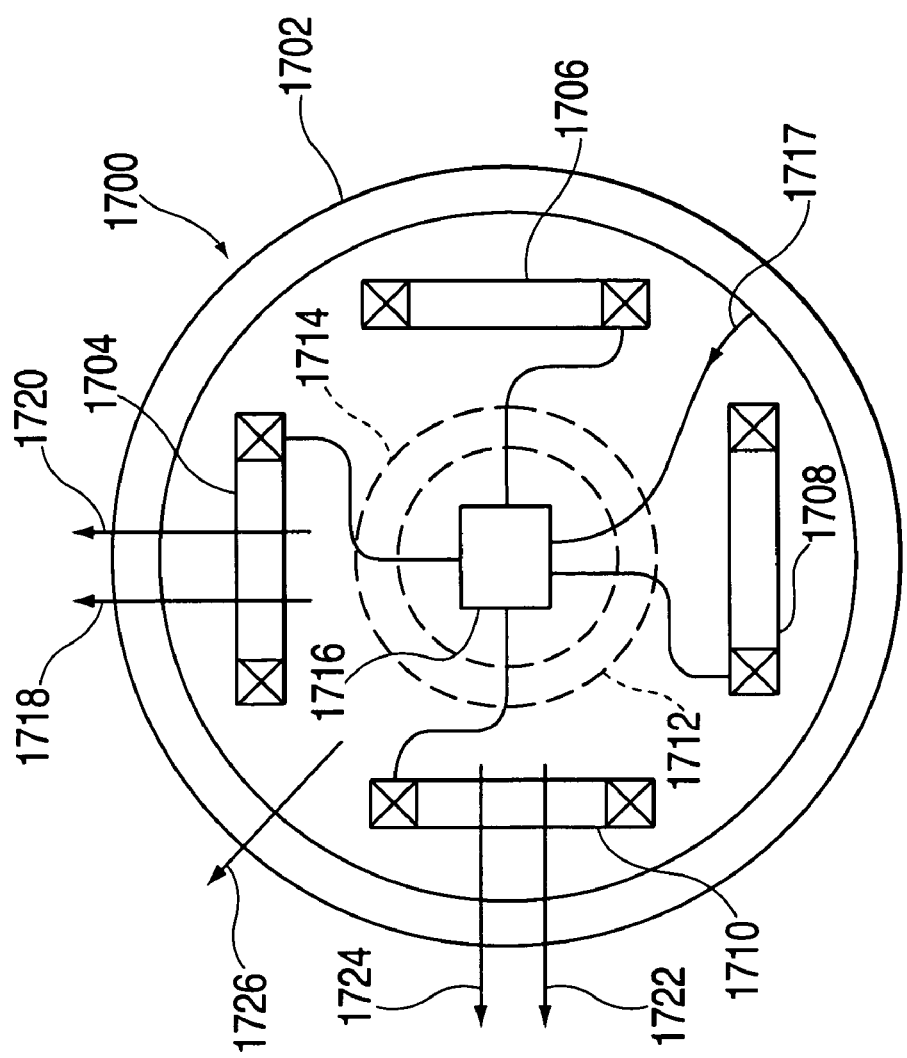
FIG. 17 is an illustrative schematic diagram of an electromechanical propulsion system constructed in accordance with the principles of the present invention.

FIG. 17 shows a propulsion system 1700 constructed in accordance with the present invention in which an object immersed in a working substance is moved in a controllable direction as a result of variations in molecular impacts of working substance molecules into the object. System 1700 includes sphere 1702 and a series of electromagnets 1704, 1706, 1708, 1710, 1712 and 1714 (1712 and 1714 are shown as a single pair of dotted lines) arranged axially about electronics core 1716 (axially simply refers to the fact that there is one electromagnet located parallel to each of the six sides of electronics core 1716, and that each electromagnet may have its center aligned with an imaginary axis extending perpendicular to the core surface). These electromagnets, along with a control system form a drive system that, as set forth in more detail below, helps to propel sphere 1702.

Sphere 1702 may be any three-dimensional object. Although a sphere is shown, other shapes such as a cube, cylinder, etc., may be used. The surface of sphere 1702 is covered with nanometer scale assemblies, such as a series of nanotubes, that are mounted to the surface with some slack, as described above with respect to FIGS. 11–16.

Electromagnets 1704, 1706, 1708, 1710, 1712 and 1714 may be powered from, for example, a battery or some other source. In any case, external power is provided to electronics core 1716 that is then provided to the appropriate electromagnets, as described below.

Assuming sphere 1702 is located in a fluid maintained at non-zero temperature, when one electromagnet is energized, such as electromagnet 1704, the resultant magnetic field 1718, along with the nanotube assembly, lowers the fluid pressure immediately above the surface. The reduced pressure causes sphere 1702 to move in direction 1720 (if the propulsion force is strong enough). If, for example, electromagnet 1710 is also energized, thereby establishing magnetic field 1722, a force 1724 also affects sphere 1702. In this instance, sphere 1702 would be propelled along a vector 45 degrees away from magnetic axes 1718 and 1722 (as shown by arrow 1726). By varying the current supplied to each of the electromagnets, the movement of sphere 1702 through a fluid can be controlled.

Turning back to FIG. 3, persons skilled in the art will recognize that Johnson noise may be present in system 300. Johnson noise is a result of the random movement of carriers, generally brought about because of temperature vibrations, in the body of a resistor that generates an unwanted voltage. Although Johnson noise is typically not a problem in centimeter scale resistors that are employed to regulate standard voltages (e.g., 124 volts), Johnson noise can be troublesome in nanometer scale resistors because the Johnson noise may cancel all, or some, of the infinitesimally small voltages that need to be regulated. Because piezoelectric generators 304, 324, and 344 of system 300 generate infinitesimally small voltages around resistors 308, 328, and 348, respectively, Johnson noise in these resistors may cancel a portion of the system's output power.

To mitigate the effects of Johnson noise from system 300, automatic switches may be included to selectively couple piezoelectric generators 304, 324, and 344 with resistors 308, 328, and 348, respectively. When such an automatic switch is ON, a closed circuit exists between the two components that allows the resistor to draw current from the piezoelectric generator's potential. When such an automatic switch is OFF, an open circuit exists between the two components and no potential will be applied across the resistor. In controlling the ON and OFF times of the automatic switches with respect to the amount of potential generated by the piezoelectric generators, the voltages regulated by the resistors can be controlled. This "turn-on" voltage would preferably be greater than the average voltage created by Johnson noise, thus essentially removing the negative effects of Johnson noise from the system.

Figure 18:
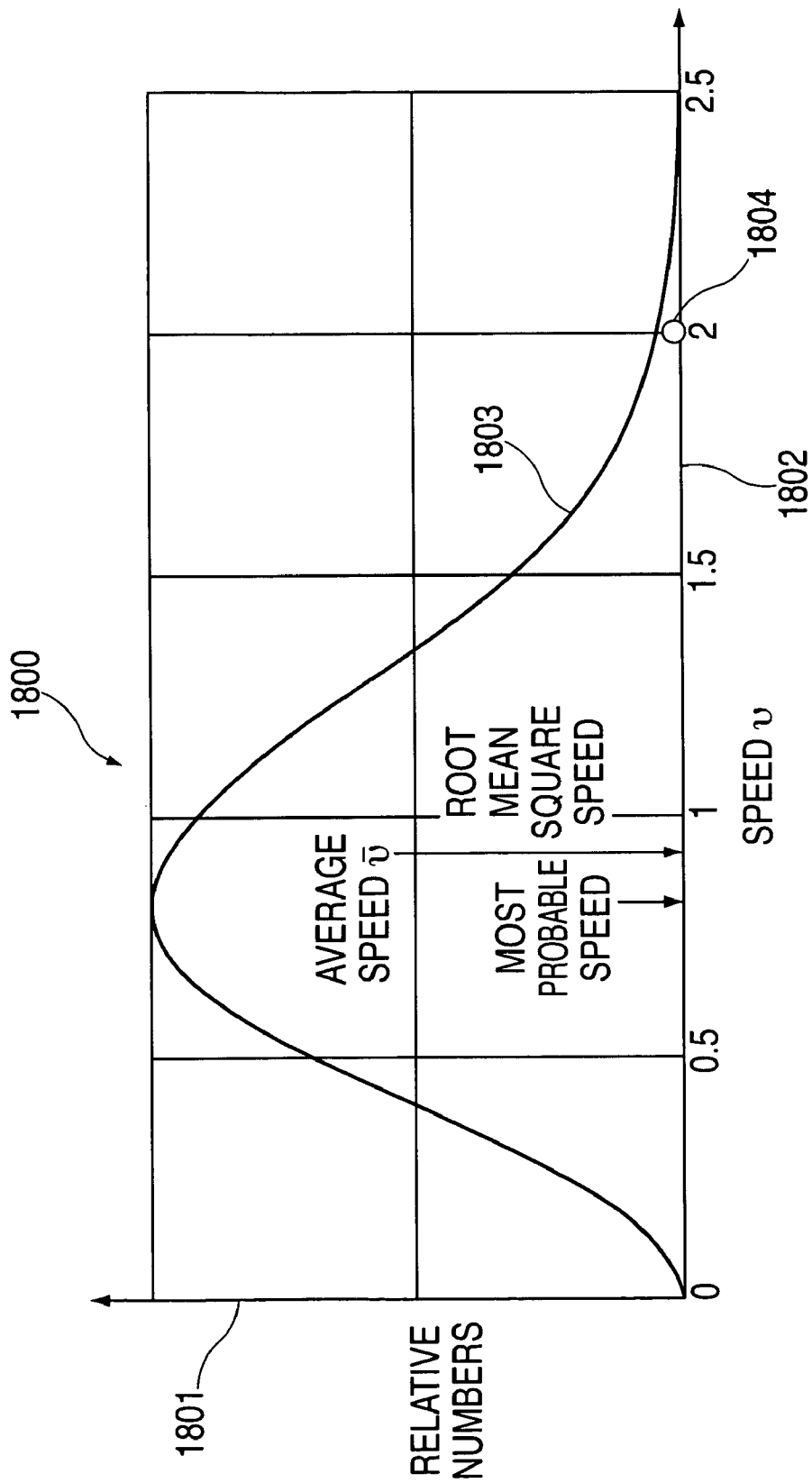
FIG. 18 is a graphical representation of a velocity versus potential curve for nanometer piezoelectric generator assemblies constructed in accordance with the principles of the present invention.

Graph 1800 of FIG. 18 shows Maxwellian distribution curve 1800 with respect to vertical axis 1801 and horizontal axis 1802. Particularly, vertical axis 1801 represents the number of possible molecules in a working substance. Horizontal axis 1802 represents the possible velocities for a molecule in a working substance. Maxwellian curve 1800 therefore shows the range of velocities that molecules have in a working substance. Persons skilled in the art will appreciate that Maxwellian curve 1800 will distort depending on a variety of factors. For example, if the temperature of the working substance increases, Maxwellian curve 1800 will take on a different shape as the average speed of a molecule increases.

Looking at graph 1800, it becomes apparent that, at any one time, multiple molecules having a wide range of velocities may impact paddles 302, 322, and 342 of FIG. 3. Accordingly, paddles 302, 322, and 342 will bend according to the force created by these impacts. At any instance, hundreds, or even thousands, of molecules may impact paddles 302, 322, and 342. As previously stated, the automatic switches of the present invention are preferably constructed such that piezoelectric generators 304, 324, and 344 couple to resistors 308, 328, and 348 when the potential generated by piezoelectric generators 304, 324, and 344 is greater than the Johnson noise present in resistors 308, 328, and 348. Because the amount of potential created by system 300 of FIG. 3 is indicative of the amount of force applied to paddles 302, 322, and 342, persons skilled in the art will appreciate that the automatic switches may be constructed such that piezoelectric generators 304, 324, and 344 couple resistors 308, 328, and 348, respectively, when the total force of all the molecules impacting on paddles 302, 322, and 342 has at least a particular magnitude and a particular direction.

As will be described later in conjunction with system 2700 of FIG. 27, systems of the present invention do not have to be immersed in a working substance in order to operate. More particularly, an object will oscillate at an average speed that is proportional to its temperature and inversely proportional to its mass. Thus, the embodiments of the present invention may operate in a vacuum and may be excited by temperature. Heat sources may therefore be included. These heat sources may be low grade heat sources (e.g., body heat) or the heat provided by sunlight. Although such embodiments do not require a surrounding fluid to operate, immersing them in a working substance may be beneficial.

Figure 19:
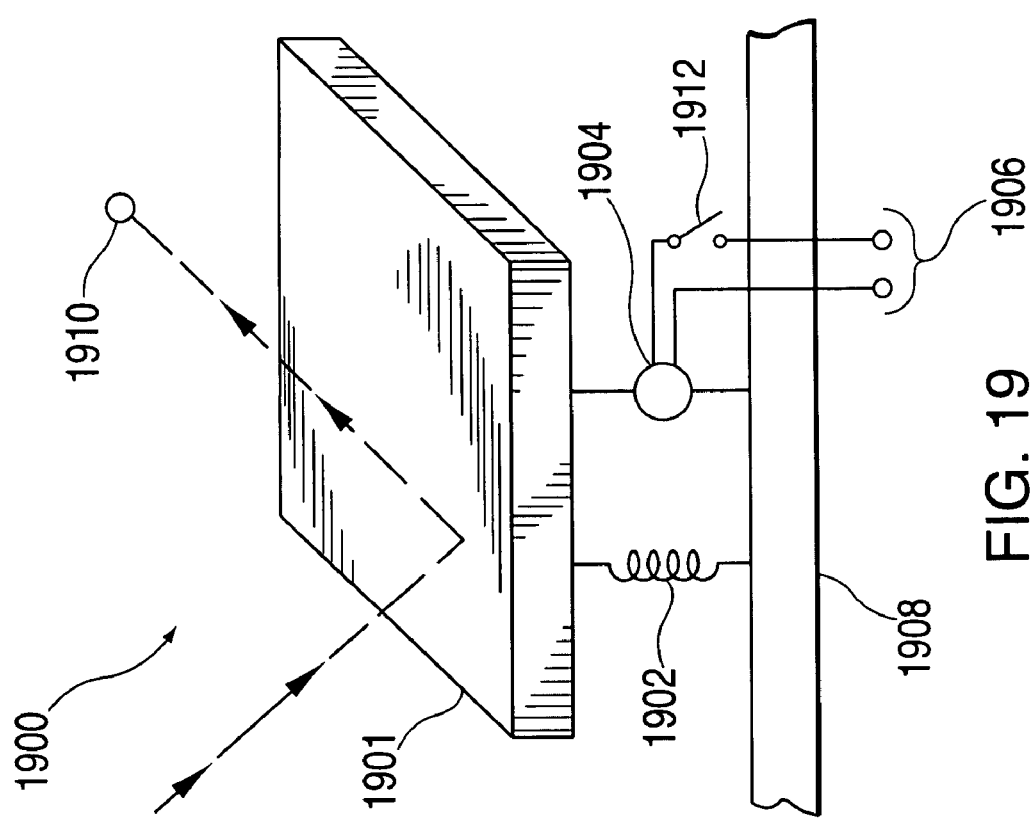
FIG. 19 is an illustrative schematic diagram of a portion of an alternative embodiment of a nanometer scale electromechanical system constructed in accordance with the present invention.

FIG. 19. illustrates an example of a portion of a nano-electromechanical system 1900 utilizing paddle 1901 configured with automatic switch 1912 constructed in accordance with the present invention. System 1900 includes an impact mass in the form of paddle 1901, restraining member 1902, generator device 1904 (which provides an electrical output at leads 1906 dependent on the state of switch 1912), and base 1908 (which is typically thousands, or millions, times larger than paddle 1900). Paddle 1901 is attached to base 1908, which may be thermally conductive, but need not be, so that paddle 1901 may be moved within a predetermined range of distance in one or more directions (such as laterally, or up and down).

Persons skilled in the art will appreciate that more than one restraining member 1902 may connect paddle 1910 to base 1908. For example, two opposite ends of paddle 1901 may be restrained by two separate restraining members 1902. In such an embodiment, paddle 1901 may take the form of a net and produce a infinitesimally small, yet useable, potential when impacted by a molecule or a group of molecules.

Also shown in FIG. 19, molecule 1910 is shown as having bounced off of paddle 1901, and is now traveling at a reduced velocity. Persons skilled in the art will appreciate that, while some molecules will have a reduced velocity as a result of the impact, others may exhibit little change in velocity, and others may actually achieve an increased velocity. In general, however, the impact of molecule 1910 with paddle 1901 results, on average, with a reduction in velocity.

Molecule 1910 is preferably a molecule of the working substance of the system, which is preferably a fluid (e.g., a gas or a liquid), but may also be a solid. As described above, the pressure of the working fluid may have an impact in the output provided by the system. Thus, it may be preferable to submerse system 1900 in a working substance with a large density of molecules moving at high velocities. Heat may also be introduced on this working substance in order to increase the velocities of the molecules that the working substance contains.

The reduction in velocity of molecule 1910 is caused by paddle 1901 in conjunction with device 1904, which may be any one of a variety of devices without departing from the principles of the present invention. For example, device 1904 may be a piezoelectric device, or it may be a electromotive force or electrostatic generator. In each instance, device 1904 converts the kinetic energy of the impact mass, from the impact of molecule 1910 into impact mass 1900, into output electrical energy via leads 1906.

The amount of electrical output via leads 1906, even under the most favorable conditions, will be very small. For example, the output of paddle 1900 may be on the order of about $10^{-12}$ watts, depending on the size of the device and various other factors. Accordingly, for the system to provide useful output power, such as, for example, a few microwatts, the system requires that millions of such paddles be fabricated and connected together, such that the outputs of all, or substantially all of the systems, can be summed into a single output signal.

Persons skilled in the art will appreciate that system 1900 may operate without a working substance. More particularly, system 1900 may operate in a vacuum and paddle 1901 may vibrate due to its finite temperature.

As discussed above, Johnson noise of the electrical circuit that includes elements coupled to leads 1906 may cancel some or all of a generator's output power if the voltage of generator 1904 is not large enough. Switch 1912 may be included at leads 1906 to control when the output power of paddle 1901 is utilized. Switch 1912 may be configured so that the output power of generator 1904 is only utilized when a minimum amount of voltage has been created. Preferably, this minimum amount of voltage will be greater than the average amount of voltage created by Johnson noise of the circuit elements coupled to leads 1906.

The direction that a paddle is moved by a working substance (or by its own thermal vibrations) affects the direction that paddle 1901 is moved. Different directional stresses on paddle 1900 may result in different polarities of voltages being produced. It should be noted that in the illustrated embodiment of system 1900, movement of paddle 1901 upward from its resting location and then downward to its resting location generates a voltage of one polarity. Movement downward and then upward back to the resting location generates a voltage in the opposite polarity. In this manner, when a paddle is struck by a molecule, the paddle may vibrate between both sides of the resting location and create potentials of both polarities (e.g. an AC voltage). Accordingly, switch 1906 can be constructed to open only when a minimum voltage of a specific polarity is achieved by the paddle. In other words, switch 1912 can also be used to create a pulsating DC voltage.

Figure 20:
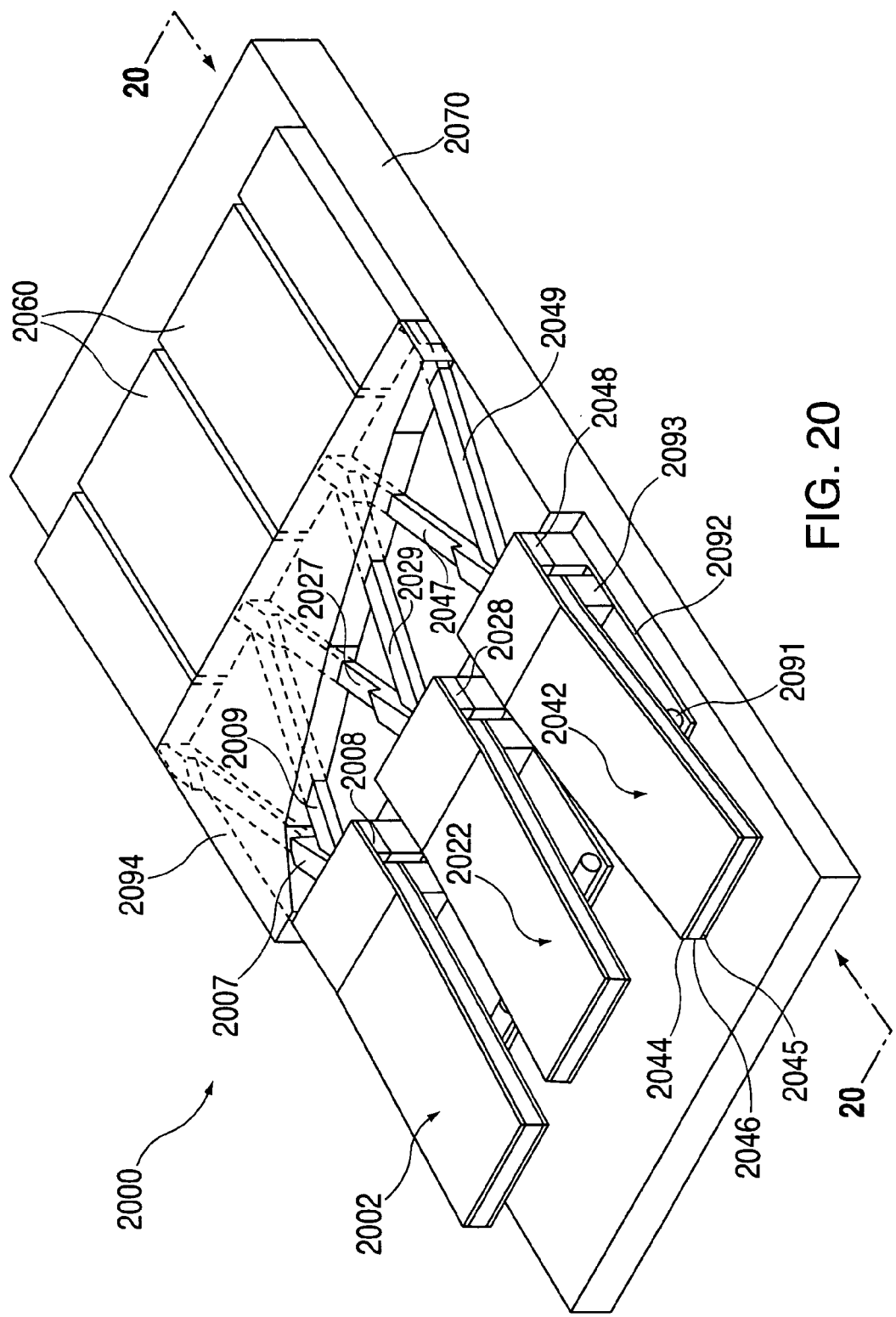
FIG. 20 is a perspective view of a portion of the nanometer scale electromechanical system of FIG. 19.

FIG. 20 is a perspective view of a portion of nanometer scale electromechanical system 2000 constructed with an automatic switch that reduces the effects of Johnson noise while forming a randomly pulsating DC output voltage. System 2000 is similar to system 300 of FIG. 3. However, system 2000 includes switch 2091 and integrates the piezoelectric layer into the paddle assemblies(e.g, paddle assemblies 2002, 2022, and 2042). In system 2000, the paddle assemblies are piezoelectric generators configured as paddles.

For example, paddle assembly 2042 is a piezoelectric generator formed by upper conductive layer 2044, piezoelectric material 2046, and lower conductive layer 2045. Thus, when paddle assembly 2042 absorbs energy from impacting molecules (or its own thermal vibrations in a vacuum), piezoelectric material 2046 will be stressed and a potential will be formed between upper conductive layer 2044 and lower conductive layer 2045. When this potential is connected to resistor assembly 2048, a current will flow through resistor assembly 2048. Heat is produced as a byproduct of current flowing through resistor assembly 2048. This heat can be captured by a thermoelectric generator or it can be used to heat a different substance.

Automatic switch 2091 influences when paddle assembly 2042 will be attached to resistor assembly 2048. Thus, switch 2091 influences when the voltage generating attributes of paddle assembly 2024 are attached to resistor assembly 2048. Specifically, one side of resistor assembly is attached to upper conductive layer 2044. The opposite side of resistor assembly 2048 is connected to switch 2091 via conductive extension 2092.

Automatic switch 2091 is placed near paddle assembly 2042 such that when paddle assembly 2042 is in a resting location, lower conductive layer 2045 does not come into contact with switch 2091 and an open circuit exists between paddle assembly 2042 and resistor assembly 2048. However, switch 2091 is also preferably placed near paddle assembly 2042 so that when paddle assembly 2042 is displaced a desired distance from its resting location, lower conductive layer 2045 comes into contact with switch 2091 and a closed circuit exists between paddle assembly 2042 and resistor assembly 2048. An isolating layer 2093 may be placed to separate lower conductive layer 2045 from layer 2092.

Decreasing the distance between automatic switch 2091 and the resting location of paddle assembly 2042 will increase the number of times that lower conductive layer 2045 will come into contact with switch 2091 per unit time when system 2000 is immersed into a working substance. Persons skilled in the art will appreciate that system 2000 may also work in a vacuum that does not contain any working substance. Such a system may utilize the thermal characteristics of the paddle itself. In particular, paddle assembly 2042 may oscillate due to thermal vibrations. In this manner, if the distance between switch 2091 and the resting location of paddle assembly 2042 is decreased then the number of times that lower conductive layer 2045 will come into contact with switch 2091 will, preferably, increase.

Persons skilled in the art will recognize that shifting the position of automatic switch 2091 laterally underneath paddle assembly 2042 may also increase, or decrease, the number of times that lower conductive layer 2045 may come into contact with automatic switch 2091. Similarly, increasing the distance between automatic switch 2091 and the resting location of paddle assembly 2048, or the location of switch 2091, will decrease the number of times that lower conductive layer 2045 will come into contact with automatic switch 2091.

In increasing the distance between switch 2091 and the resting location of paddle assembly 2042, the amount of force needed to close paddle assembly 2042 to switch 2091 also increases. This increased amount of force is directly proportional to the amount of stress induced upon piezoelectric layer 2046 of paddle assembly 2042. Thus, this increased amount of force will result in a higher potential being created in the piezoelectric generator. To minimize the effects of Johnson noise in resistor assembly 2048, the distance between automatic switch 2091 and the resting location of paddle assembly 2042 should be preferably chosen so that the amount of force required to form a closed circuit creates a potential that is greater than the average amount of potential created by Johnson noise within resistor 2048.

Persons skilled in the art will appreciate that switch 2091 may be placed on either side of paddle 2042 depending on what polarity of power is desired. Similarly, two separate automatic switches may also be included in a piezoelectric paddle assembly of the present invention. Specifically, one automatic switch may be positioned in a certain location and at a certain distance beneath a paddle assembly while a second switch may be positioned in a certain location and at a certain distance above the same paddle assembly. In doing so, an alternating current may be produced by the paddle assembly. The produced alternating current would not suffer significantly from the effects of Johnson noise of resistor 2048 because the output power of paddle assembly 2042 will, in most cases, be produced at a value greater than the Johnson noise produced by resistor 2048.

The current through resistor 2048 heats up resistor 2048, which is coupled to one side of the thermoelectric generator formed by wires 2047 and 2049 (which, as described above, are made from different materials). Wires 2047 and 2049 may be isolated from each other by isolating layer 2094. The other side of the thermoelectric generator (which may also be referred to as a thermocouple) is coupled to heat sinks 2060, which are at a lower temperature than resistor 2048. Persons skilled in the art will appreciate that other devices may be used, such as thermal to electric heat engines (such as, for example, a thermionic heat engine), rather than thermoelectric generators described herein, without departing from the spirit of the present invention.

The temperature differential causes the thermoelectric generator to produce a DC voltage, which, as described in more detail below, may be combined with the voltages from other paddle assemblies to provide a system output voltage. These voltages, in accordance with the present invention, may be coupled together in series to produce an electrical output at a useable level from system 2000. Persons skilled in the art will appreciate that the resistive element, thermoelectric generators, and heat sinks of system 2000 may be removed and electrical current routed directly from the piezoelectric assemblies. Persons skilled in the art will also appreciate that in addition to contact 2091 being a nanotube, conductive layer 2045 may also be a nanotube or may be provided on top of a nanotube. Doing so will decrease wear between layer 2045 and contact 2091.

Persons skilled in the art will recognize that automatic switch 2091 is exposed to a large number of lower conductive layer 2045 contacts per second. In practice, the number of contacts between switch 2091 and lower conductive layer 2045 could easily reach 1000 times per second. Appropriately, automatic switch 2091 is preferably constructed from a conductive material that exhibits low wear characteristics. For example, automatic switch 2091 may be constructed with a nanotube because a nanotube, as a single molecule, exhibits good wear characteristics. Yet, any electrically conductive material may be used to fabricate switch 2091. A nanotube may be placed on the bottom of lower conductive layer 2045 to reduce wear between automatic switch 2091 and lower conductive layer 2045.

Figure 21:
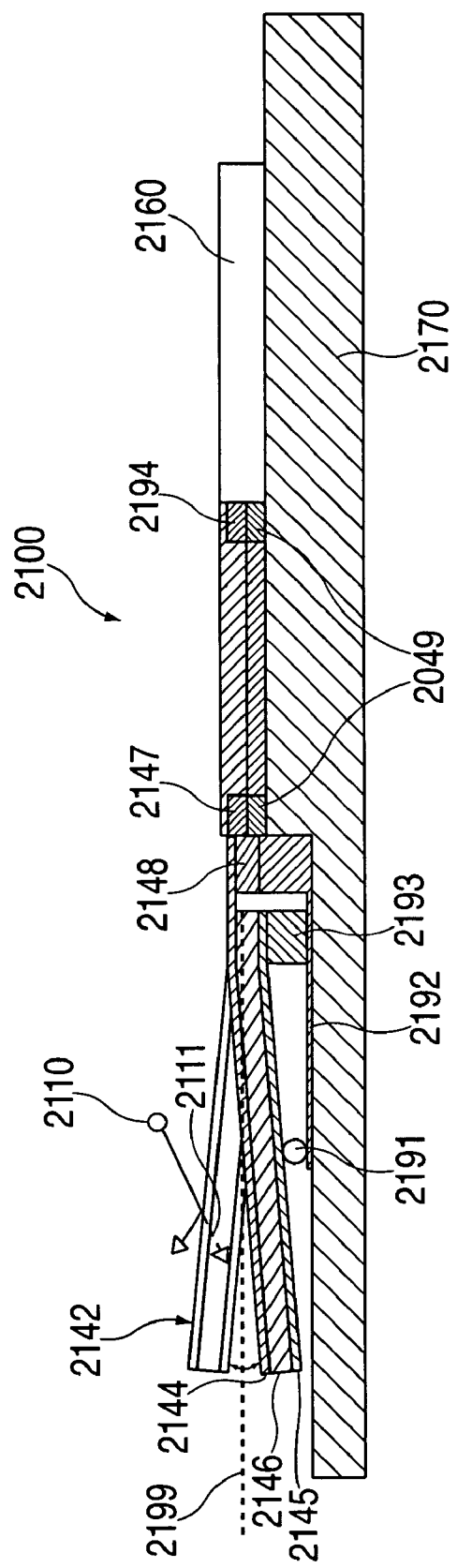
FIG. 21 is a cross-sectional plan view of the nanometer scale electromechanical system of FIG. 20 taken along line 20—20.

FIG. 21 illustrates system 2100 which is a cross-sectional plan view of the nanometer scale electromechanical system of FIG. 20 taken along line 20—20. System 2100 preferably operates in the same manner as system 2000. Particularly, when paddle assembly 2142 is located about resting location 2199 and molecule 2110 (or a group of molecules 2110) strikes paddle assembly 2142 the resultant force 2111 absorbed by paddle assembly 2142 will cause paddle assembly 2142 to vibrate about resting location 2199. If force 2111 is large enough (e.g., if the vertical component of force 2111 is large enough), paddle assembly 2142 will come into contact with contact 2191. At this instance, the potential produced across paddle assembly 2042 as a result of the imposed stress on piezoelectric layer 2146 will be carried through upper conductive layer 2144 to one side of resistor 2148 and through lower conductive layer 2145, switch 2191, and conductive layer 2192 to the other side of resistor 2148.

The potential applied across resistor 2148 will result in resistor 2148 heating up. The heat of this resistor is carried through wires 2147 and 2149 to heat sink 2160. Heat from other paddle assemblies (e.g., an adjacent paddle assembly) may also be carried into heat sink 2160 via wire 2194.

Figure 22:
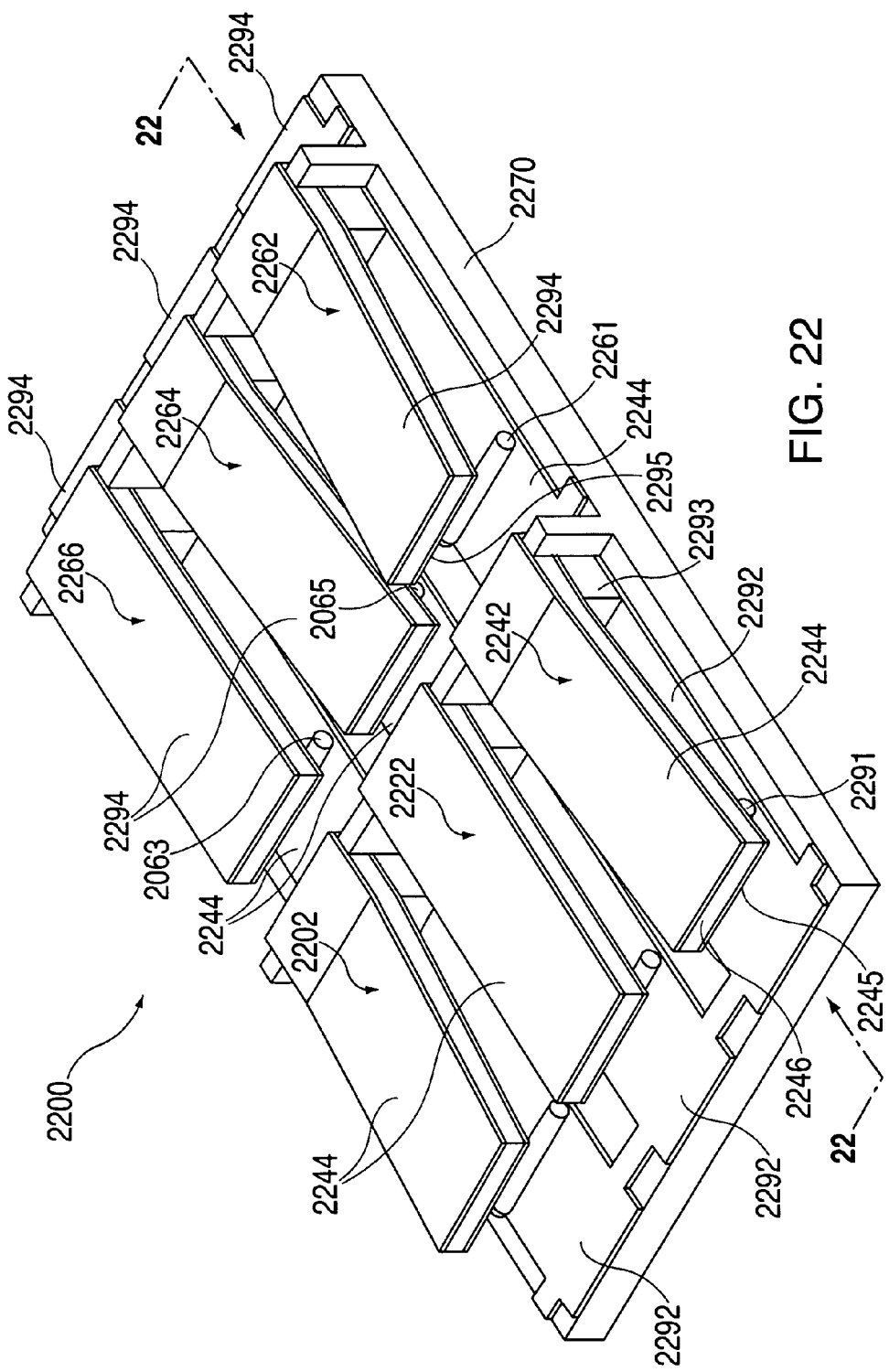
FIG. 22 is a perspective view of an alternative embodiment of nanometer scale electromechanical systems constructed in accordance with the principles of the present invention.

Persons skilled in the art will appreciate that the thermoelectric generating components of system 2100 are not needed to obtain an electrical current or potential. Additionally, the individual resistor assemblies of system 2100 are not needed to obtain an electrical current or potential. FIG. 22 illustrates system 2200 which is an array of an alternative embodiment of nanometer scale electromechanical systems that does not include individual resistor assemblies or thermoelectric generator components.

Paddle 2242 of system 2200 is constructed without a resistor assembly or thermoelectric generator components. As a result, a larger number of paddle assemblies 2242 may be placed in an array than paddle assemblies that integrate a resistor assembly and thermoelectric generator components. Similar to paddle assembly 2142 system 2100 of FIG. 21, paddle assembly 2242 forms a piezoelectric generator such that when piezoelectric layer 2246 is displaced from its resting location, stress is placed on piezoelectric layer 2246 that creates a potential between upper conductive layer 2244 and lower conductive layer 2245. Switch 2291 controls when this potential is allowed to pass onto the output of system 2200 (shown in system 2300 of FIG. 23).

Persons skilled in the art will appreciate that the paddle assemblies of system 2200 are in a different configuration than those of system 2100. Particularly, the automatic switch 2261 is utilized to open and close the circuit between lower conductive layer 2295 of paddle assembly 2262 and upper conductive layer 2244 of different paddle assembly 2242. In this manner, system 2100 places paddle assemblies 2242 and 2262 in a series configuration with each other.

Persons skilled in the art will also notice that some of the paddles of system 2200 share common upper conductive layers. Specifically, the paddle assemblies of system 2200 are divided into rows such that each row consists of multiple paddle assemblies in a parallel connection with each other. Specifically, paddles 2202, 2222, and 2242 are in a parallel connection with one another and form a portion of one of the paddle rows of system 2200. These paddle assemblies share common upper conductive layer 2244 that is subsequently connected to the automatic switches of a different paddle assembly row of system 2200 (e.g., the paddle assembly row including automatic switches 2065, 2063, and 2061).

If a molecule impacts paddle assembly 2262, a closed circuit is formed between lower conductive layer 2295 of assembly 2262 and conductive layer 2244 via switch 2261. In this example, conductive layer 2244 would approximately have a potential equivalent to the potential of layer 2294 added to (or, depending on the configuration of assembly 2262, subtracted from) the potential created by the piezoelectric layer of paddle assembly 2262. Now, if assembly 2202 is also closed then conductive layer 2292 will be approximately equivalent to the voltage potential created by assemblies 2202 and 2262 added to (or, depending upon the configuration of the assemblies, subtracted from) the voltage at conductive layer 2294.

Figure 23:
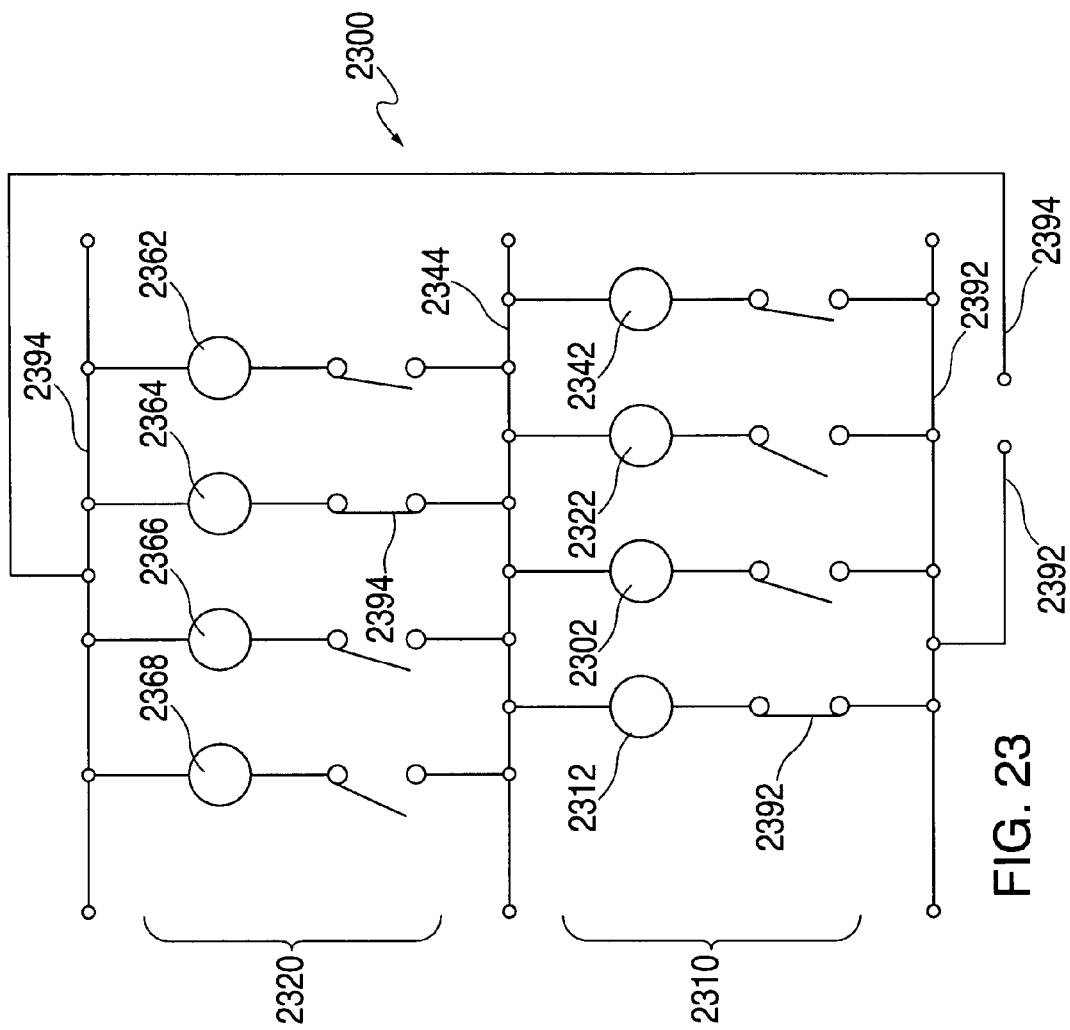
FIG. 23 is an illustrative schematic diagram of an array of the nanometer scale electromechanical systems of FIG. 22.

System 2200 may contain millions, if not billions, of paddle assemblies (e.g., piezoelectric generators) and thousands, if not millions, of rows of paddle assemblies. FIG. 23 depicts circuit 2300 in which the array principles of system 2200 of FIG. 22 are illustrated. Particularly, circuit 2300 includes two rows (e.g., rows 2310 and 2320) of paddle assemblies. Row 2310 includes paddle assemblies 2312, 2302, 2322, and 2342, while row 2320 includes paddle assemblies 2368, 2366, 2364 and 2362. Each paddle assembly is controlled by an automatic switch similar to automatic switch 2261 of FIG. 22.

Persons skilled in the art will appreciate that the configuration of the paddle assemblies of circuit 2300 will preferably result in an additive function across the voltages generated between lines 2392, 2344, and 2394. For example, in the instance captured in circuit 2300 only switches 2392 and 2394 are closed. As a result, the potential across lines 2392 and 2394 is substantially equivalent to the total potential generated by both paddle assemblies 2312 and 2364. As stated above, the paddle assemblies in each individual row of system 2300 are placed in a parallel connection. Each row of system 2300 is placed in a series connection.

Figure 24:
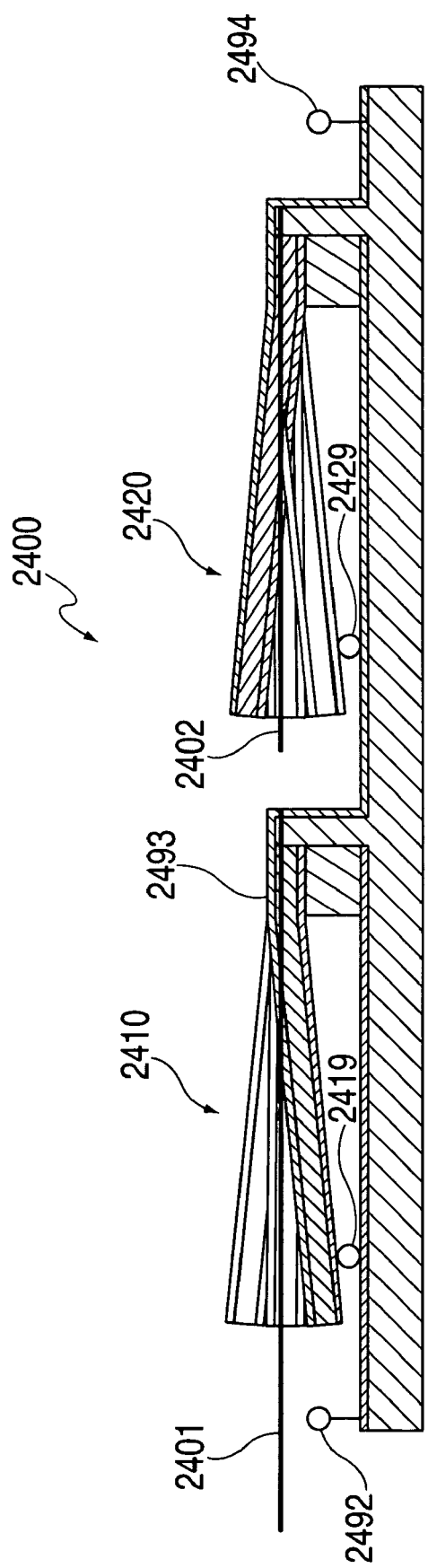
FIG. 24 is a cross-sectional plan view of the nanometer scale electromechanical system of FIG. 22 taken along line 22—22.

Turning to FIG. 24, system 2400 is illustrated and is a cross-sectional plan view of the nanometer scale electromechanical system of FIG. 22 taken along line 22—22. System 2400 includes paddle assemblies 2410 and 2420 configured between contact lines 2492 and 2494. Paddle assemblies 2410 and 2420 are each included in separate paddle assembly rows(not shown).

Paddle assemblies 2410 and 2420 are shown with respect to their resting locations 2401 and 2402, respectively. An intermediate contact layer 2493 is also included between paddle assemblies 2410 and 2420. When both paddle assembly 2410 closes on automatic switch 2419 and paddle assembly 2420 closes on automatic switch 2429, the potential between contact line 2492 and contact line 2494 will be substantially equivalent to the total of the potentials created by paddle assemblies 2410 and 2420. By including more rows (placed in a series connection) into the array of system 2400, the higher the potential will be between lines 2492 and 2494.

Figure 25:
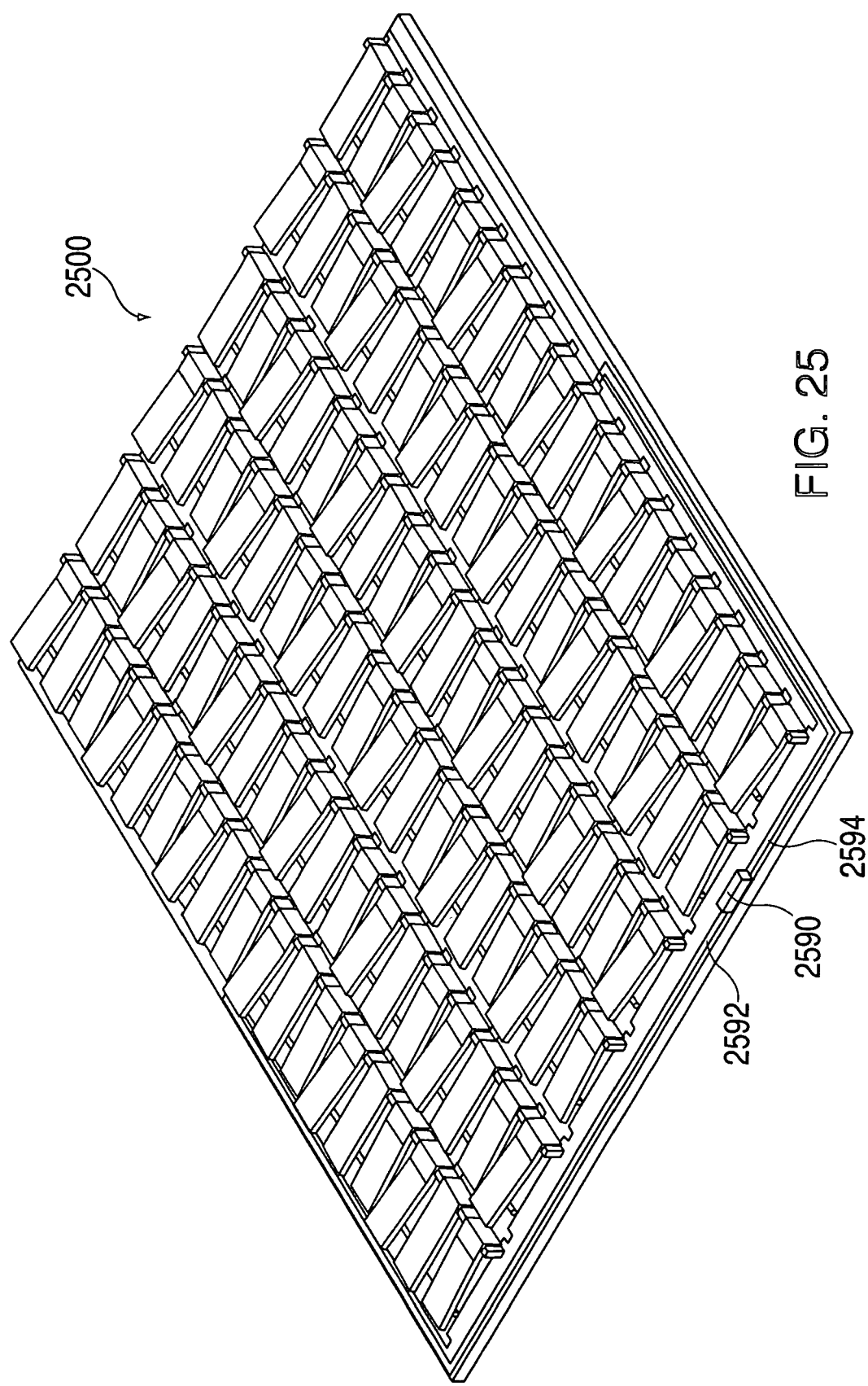
FIG. 25 is a perspective view of an array of the nanometer scale electromechanical systems of FIG. 22.

A load resistor may be placed between lines 2492 and 2494 as shown in system 2500 of FIG. 25. FIG. 25 illustrates system 2500 that includes load resistor 2590 between lines 2592 and 2594. Load resistor 2590 may be thermally isolated from the working substance.

Persons skilled in the art will appreciate that the principles of the automatic switches discussed in connection with FIGS. 19–25 may be employed in the other nanometer scale energy conversion systems discussed above. For example, an automatic switch may be added to system 1300 of FIG. 13 in order to reduce the effects of Johnson noise. Additionally, automatic switches of the present invention may be fabricated without adding any additional components or structures.

Figure 13:
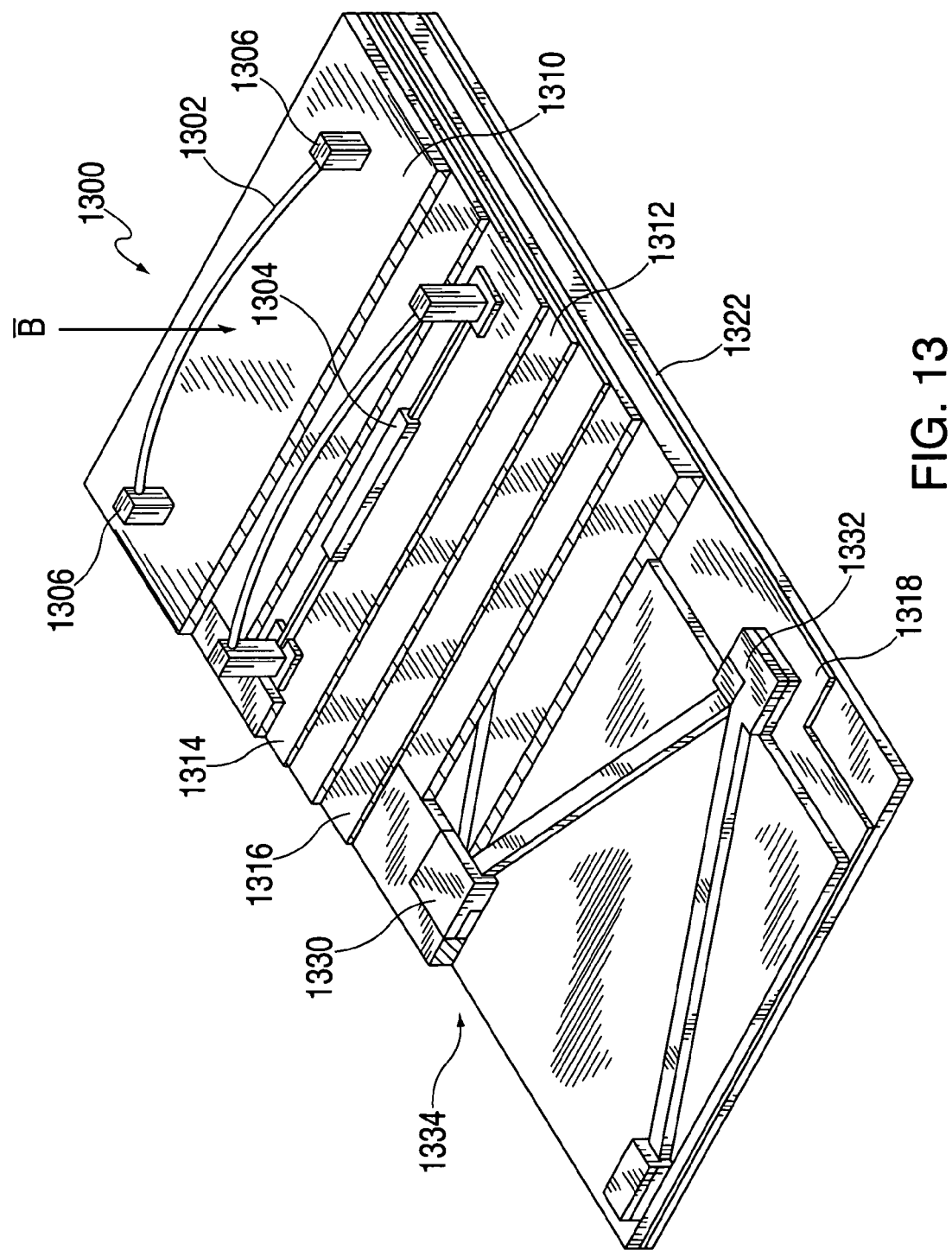
FIG. 13 is a perspective, partial cross-sectional view of another nanometer scale electromechanical system constructed in accordance with the principles of the present invention.
Figure 14:
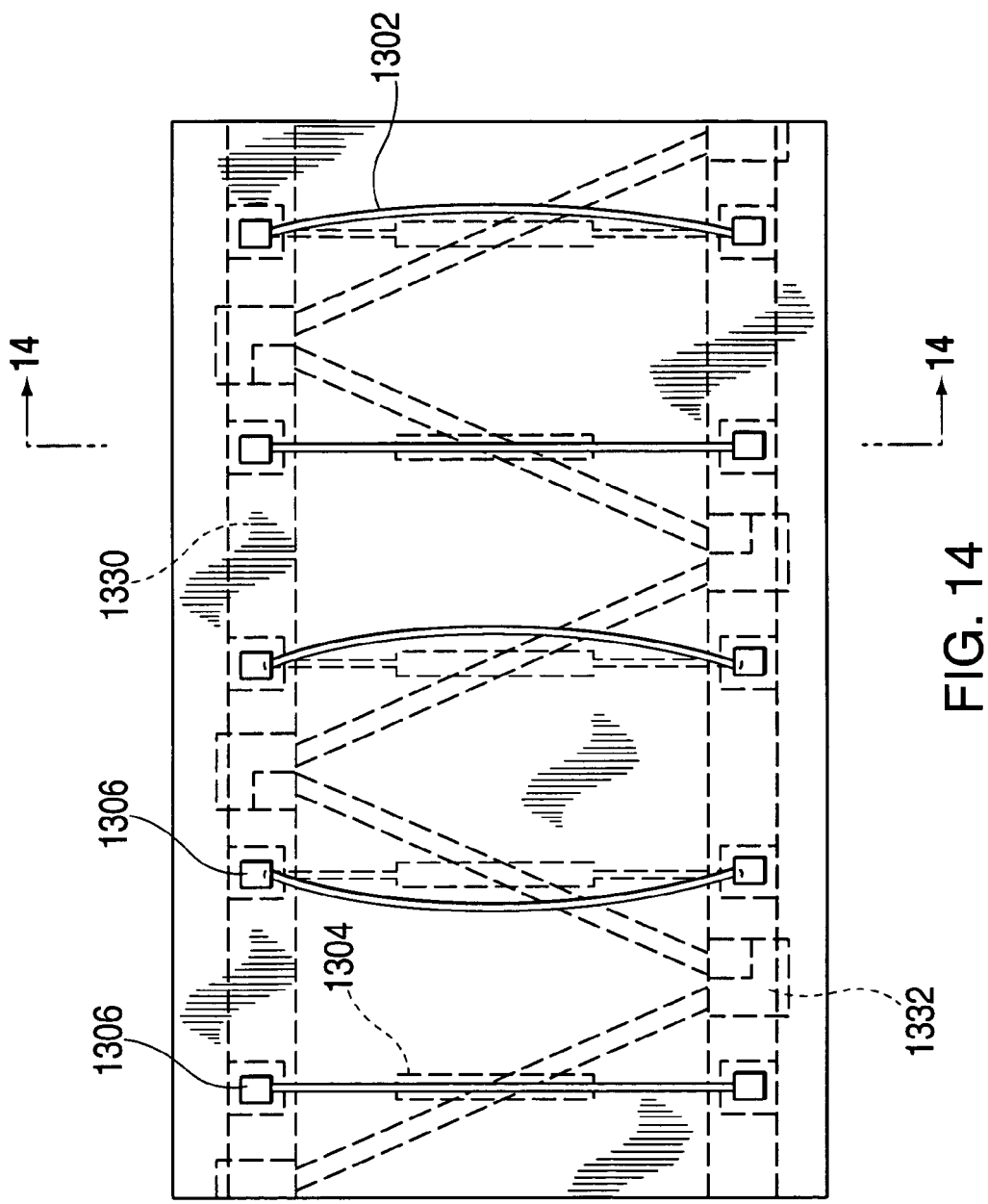
FIG. 14 is an illustrative schematic diagram of a portion of the nanometer scale electromechanical system of FIG. 13.

For example, load resistor 1304 of FIG. 13 may be specially shaped to have a specific critical magnetic field so that resistor 1304 operates as a superconductor with zero internal resistance (e.g., no Johnson noise) when LOW currents pass through it. The critical magnetic field of resistor 1304 could be shaped to have a specific critical magnetic field so that resistor 1304 operates as a normal resistive conductor when HIGH currents pass through it. Persons skilled in the art will appreciate that only when HIGH currents pass through resistor 1304 will resistor 1304 heat up and produce useable energy. In other words, resistor 1304 may be fabricated using a superconducting material. System 1300 may then be placed in a thermally insulated chamber and cooled to a temperature where resistor 1304 loses all electrical resistance (i.e., becomes superconducting) when not conducting unusually HIGH currents.

In the above example, the shaping of resistor 1304 creates an automatic switch in accordance with the principles of the present invention. More specifically, HIGH currents only occur in resistor 1304 when the nanotubes are hit by molecules moving at relatively HIGH velocities because HIGH currents produce a HIGH magnetic field in resistor 1304. If this HIGH magnetic field is large enough, it will overcome the resistor's critical magnetic field and become a normal resistive conductor. Yet, LOW currents occur when the nanotubes are hit by molecules moving at relatively LOW velocities. LOW currents produce a LOW magnetic field in resistor 1304. If this LOW magnetic field is not large enough to overcome the resistor's critical magnetic field, resistor 1304 will remain in a superconducting state. As shown, the principles of shaping load resistor 1304 are similar to those associated with constructing automatic switch 2392 of FIG. 23.

Figure 26:
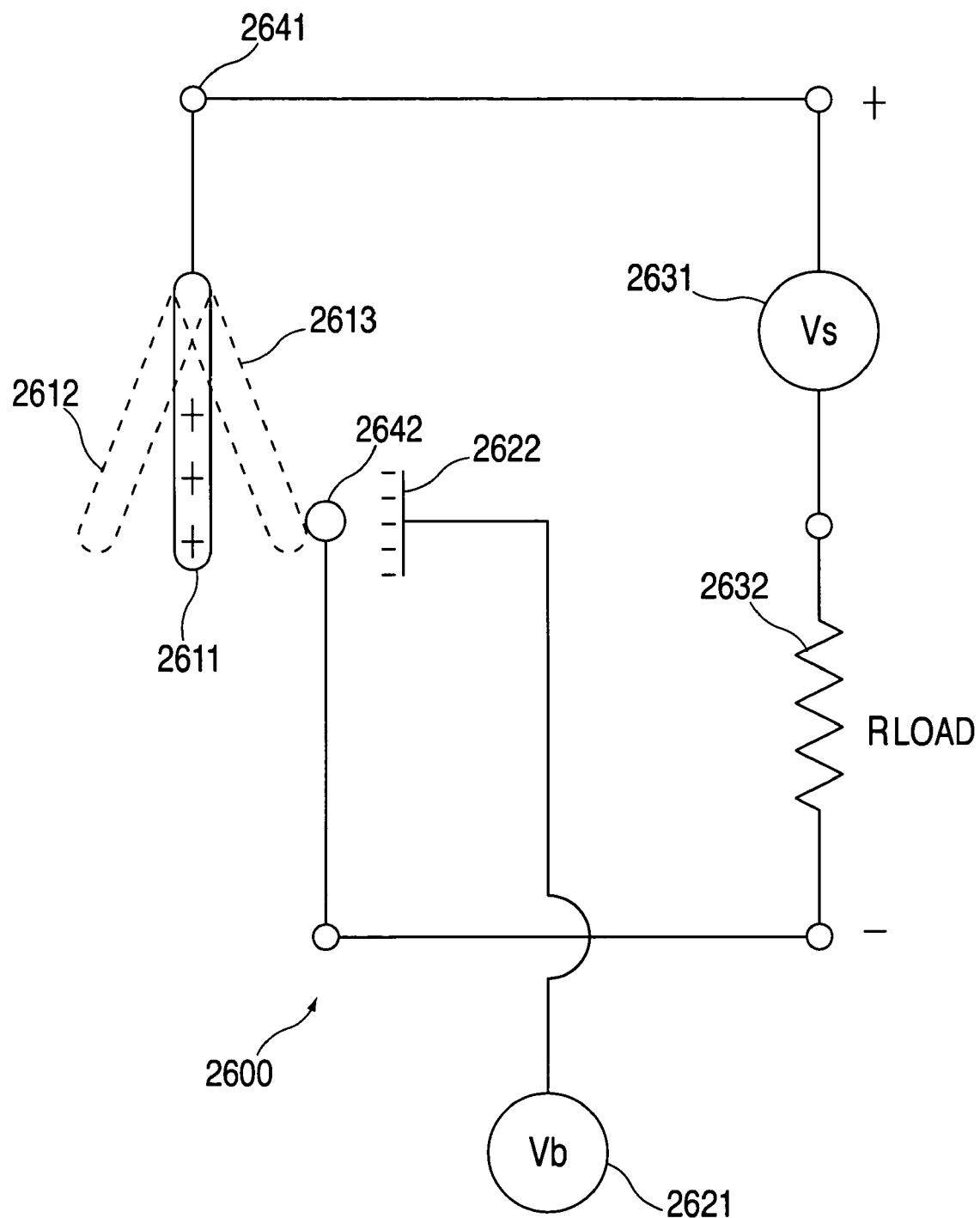
FIG. 26 is a circuit schematic of a nanometer scale transistor constructed in accordance with the principles of the present invention.

Turning to FIG. 26, nanometer scale transistor 2600 is illustrated. Transistor 2600 is defined by base terminal 2622, collector terminal 2641, and emitter terminal 2642. Generally, galvanic switch 2611 electrically couples collector terminal 2641 with emitter terminal 2642 when appropriate signals are applied to base terminal 2622 and collector terminal 2641. More particularly, switch 2611 electrically couples to emitter terminal 2642 when signals from base voltage source 2621 positions switch 2611 to position 2613. Switch 2611 may be, for example, a positively charged nanotube or nano-wire.

Persons skilled in the art will appreciate that the designation of terminals 2622, 2641, and 2642 as a base, collector, and emitter terminal, respectively, does not limit the functionality of these terminals. For example, terminals 2622, 2641, and 2642 could be utilized as, for example, gate, source, and drain terminals, respectively.

In preferred embodiments, base terminal 2622 is a negatively charged layer located about (e.g., beneath) and electrically isolated from contact 2642. Thus, by providing switch 2611 with a positive charge, switch 2611 will attract to base terminal 2622 as the density of negative charge on base terminal 2622 increases. The amount of charge on base terminal 2622 may be controlled, for example, by base voltage source 2621. Collector terminal 2641 may be coupled to voltage source 2631 and separated from emitter terminal 2642 by load resistor 2632. Generally, it is the combination of voltages 2631 and 2621 that determines the switching characteristics of switch 2611 with contact 2642. Preferably, voltages 2631 and 2621 should have opposite polarities and the absolute value of $V_{2631}*V_{2621}$ should be of some minimum value. Base voltage 2621 may also be set such that nanotube 2611 touches emitter contact 2642 when the relative velocity of the tip of nanotube 2611 exceeds a particular amount (e.g., the velocity of point 1804 from FIG. 18) if an external magnetic field is present (not shown in FIG. 26).

Similar to assembly 1100 of FIG. 11, transistor assembly 2600 may be placed in a magnetic field. When no static charge is placed on base terminal 2622, switch 2611 moves between positions 2612 and 2613 due to its thermal vibrations and rarely (e.g., once per hour) touches emitter terminal 2642. If a static charge is placed on base terminal 2622 and switch 2611 gains positive charge by voltage source 2631, switch 2611 may connect to emitter terminal 2642 more frequently (e.g., once per millisecond). If a magnetic field is employed in nanometer scale transistor 2600, switch 2611 can be forced to stay closed (e.g., coupled to emitter terminal 2642) while current flows through switch 2611.

Persons skilled in the art will appreciate that thermal noise may be advantageously utilized through the many components of system 2600. For example, thermal noise about voltage source 2631, load resistor 2632, or the resistance of nanometer scale mechanical switch 2611 may be utilized to create the time-varying voltage at tip of mechanical switch 2611. More particularly, a DC voltage may be applied at charge member 2622 such that mechanical switch 2611 electrically couples contact 2642 when the voltage at the tip (free-moving portion) of switch 2611 reaches some minimum value. Because the voltage of switch 2611 may in some systems, like a vacuum-based system, be configured to be dependent upon thermal noise then this minimum value may relate to a minimum thermal noise value. Thus, in some embodiments, the voltage on charge member layer 2622 may be both DC and controlled while voltage on switch 2611 that is induced by thermal noise is both AC and uncontrolled.

Additional advantageous nanometer scale electromechanical assemblies are described in commonly assigned copending U.S. patent application Ser. No. 10/453,783 to Pinkerton et al., entitled "Nanoelectromechanical Transistors and Switch Systems", commonly assigned copending U.S. patent application Ser. No. 10/453,199 to Pinkerton et. Al, entitled "Nanoelectromechanical Memory Cells and Data Storage Devices", and commonly assigned copending U.S. patent application Ser. No. 10/453,326 to Pinkerton et. Al, entitled "Electromechanical Assemblies Using Molecular-Scale Electrically Conductive and Mechanically Flexible Beams and Methods for Applications of Same", which are all hereby incorporated by reference in their entirety and filed concurrently herewith.

Figure 27:
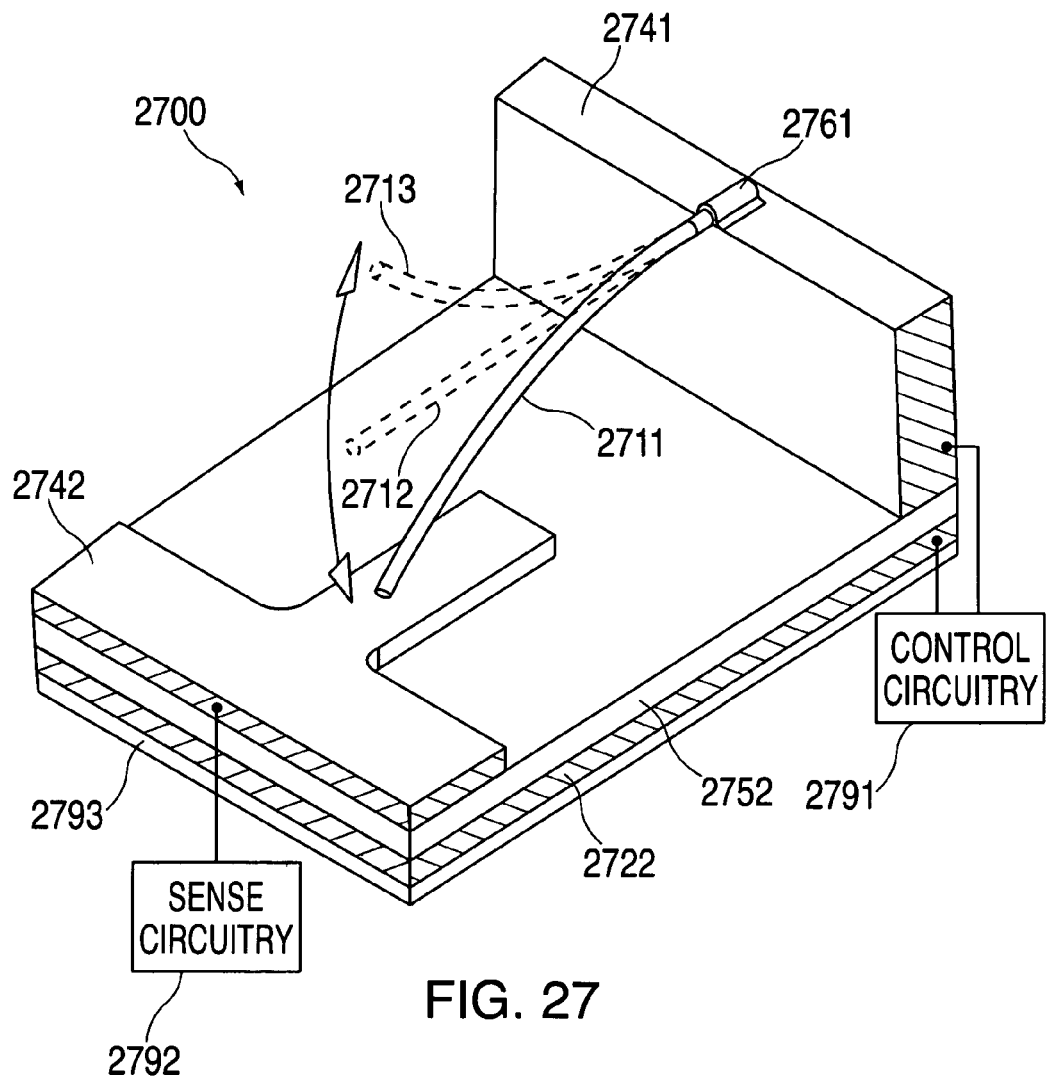
FIG. 27 is a perspective view of one embodiment of a nanometer scale transistor of FIG. 26.

FIG. 27 illustrates nanometer scale transistor 2700 that is constructed to include nanotube 2711 as a switching mechanism. As illustrated, nanotube 2711 is in a closed position such that nanotube 2711 electrically couples collector contact 2741 to emitter contact 2742. However, when nanotube 2711 is located at positions 2712 or 2713, nanotube 2711 is in an open position such that nanotube 2711 does not electrically couple collector contact 2741 to emitter contact 2742. Generally, nanotube 2711 is attracted to emitter contact 2742 when the voltage applied to collector contact 2741 and the voltage applied to charge member 2722 are of opposite polarities. Persons skilled in the art will appreciate that nanotube 2711 may be any type of mechanically flexible and electrically conductive nanometer-scale beam.

Preferably, nanotube 2711 is in a closed position when the negative charge at charge member 2722 is high enough to attract the positively charged nanotube 2711 (the positive charge of which is affected by the voltage of collector contact 2741) towards charge member 2722 to an extent where nanotube 2711 electrically couples to emitter terminal 2742. Isolation layer 2752 is provided such that the DC voltage on charge member 2722 does not leak into emitter contact 2742. Additionally, one end of nanotube 2711 is attached to collector contact 2741 by retaining member 2761.

Persons skilled in the art will appreciate that the charge profiles of a nanometer-scale beam and charge member constructed in accordance with the principles of the present invention could have any type of polarity. For example, nanotube 2711 may have a negative charge and be manipulated by a positive charge applied to charge member 2722.

Persons skilled in the art will appreciate that nanometer scale transistor 2700 may be beneficially manipulated by an external magnetic field. Introducing a magnetic field upon transistor 2700 may cause, for example, nanotube 2711 to remain in a closed position when current is flowing from collector contact 2741 to emitter contact 2742. Additionally, multiple instances of transistor 2700 may be employed and arrayed in a variety of different configurations (e.g., parallel and series configurations).

Nanotube 2711 may also be oscillated in a vacuum by a heat source. For example, nanotube 2711 may oscillate on average of about 10 meters per second at room temperature, even when transistor 2700 is operating in a vacuum. To limit wear on transistor 2700, a second nanotube may be placed on layer 2742 such that nanotube 2711 contacts this second nanotube instead of layer 2742. Moreover, layer 2742 may be replaced with a second nanotube since the collision between two nanotubes will, generally, result in little, if any, wear.

Sense circuitry 2792 may be coupled to contact layer 2742 to sense electrical signals provided by nanotube 2711 as nanotube 2711 electrically couples with contact layer 2742. Sense circuitry 2792 may also include the functionality of sensing the rate of contact between nanotube 2711 and contact layer 2742 for a period of time by sensing the number of electrical impulses provided from nanotube 2711 to contact layer 2742 per unit of time. Similarly, control circuitry 2791 may be coupled to either charge member layer 2722, contact layer 2741, or both charge member layer 2722 and contact layer 2741. Generally, control circuitry 2742 may provide electrical signals (e.g., voltage or current signals) to a particular conductive component of system 2700. Control circuitry 2742 may also control the magnitude, polarity, and frequency of such control signals. Persons skilled in the art will appreciate that control circuitry 2791 and sense circuitry 2792 may be coupled to other conductive components of system 2700. For example, control circuitry 2791 may be coupled to contact layer 2742 while sense circuitry 2792 may be coupled to contact layer 2741.

Base 2793 may be utilized as a support layer for the rest of the components of system 2700 as well as other components not shown in system 2700. For example, multiple transistor assemblies, like the one shown in system 2700, may be fabricated on a single base 2793. Base 2793 may be included as, for example, a layer of silicon. Persons skilled in the art will appreciate that nanotube 211 is generally mounted to base 2793 by way of a mounting assembly. This mounting assembly may take on various forms. As shown in system 2700, this mounting assembly may include contact layer 2741, isolation layer 2752, and charge member layer 2722. However, system 2700 may also be configured, for example, such that only contact layer 2741 or isolation layer 2742 forms this mounting assembly. More particularly, the mounting assembly fixes a portion of nanotube 2711 to base 2793 while providing nanotube 2711 with a portion that is free to move. This free-moving portion may, for example, move between positions 2712, 2713, and the position that nanotube 2711 is illustrated as being in for system 2700. As per another example, paddle 490 of FIG. 4 may be considered affixed to base 370 of FIG. 4 where base 370 of FIG. 4 is the mounting assembly for paddle 490 of FIG. 4.

Persons skilled in the art will appreciate that nanotube 2711 need not physically contact conductive layer 2742 in order for an electrical signal to pass from nanotube 2711 to conductive layer 2742. Generally, nanotube 2711 need only to electrically couple with conductive layer 2732 in order for an electrical signal to pass from nanotube 2711 to conductive layer 2742. Forms of electrical coupling may include, for example, capacitive and inductive coupling as well as any physical electrical connection between two components.

Figure 28:
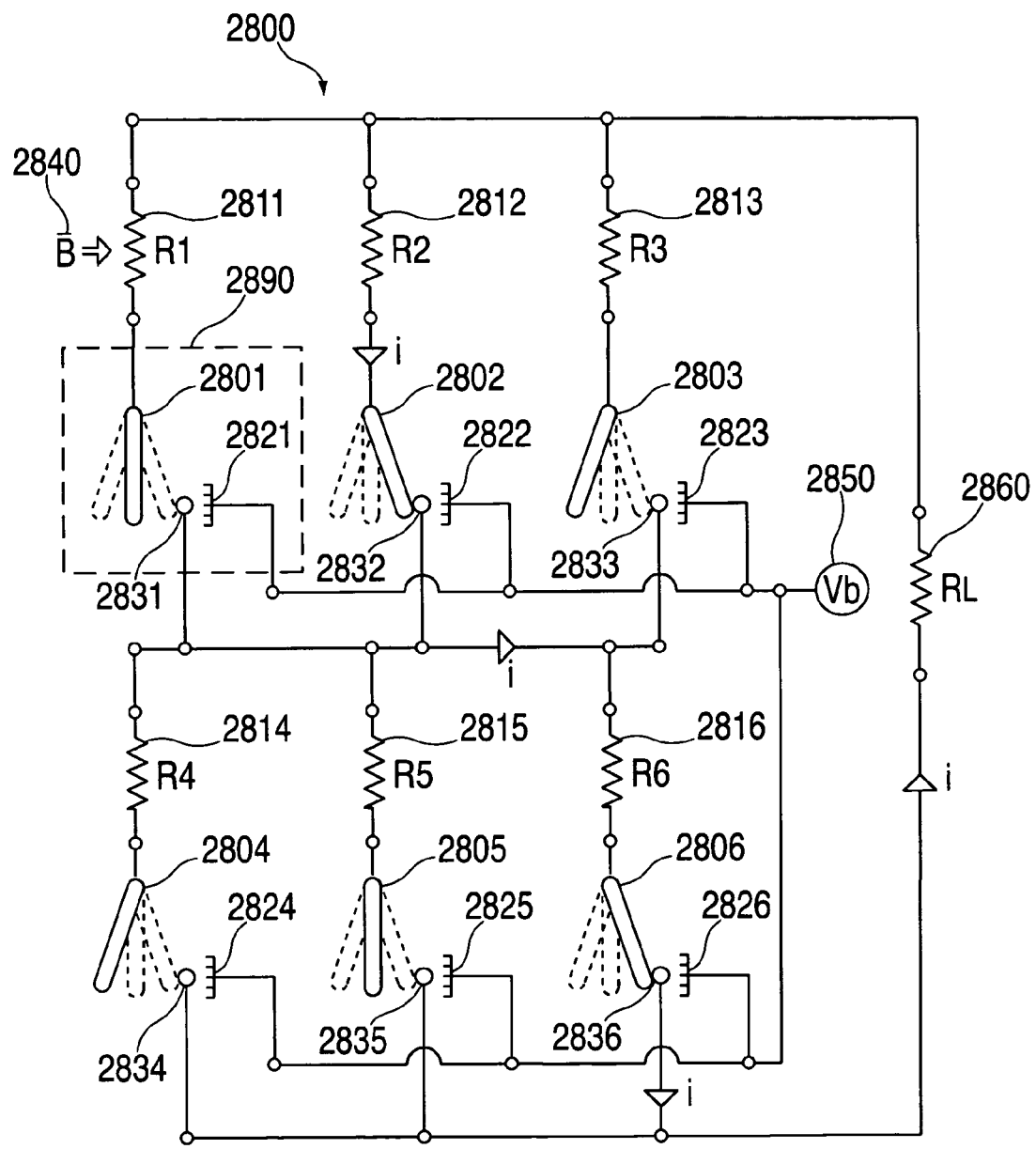
FIG. 28 is a circuit schematic of a nanometer scale electromechanical system constructed in accordance with the principles of the present invention.

Multiple instances of transistor 2700 may be arrayed together similar to system 2300 of FIG. 23 such that useful functionality is realized. Nanometer scale electromechanical system 2800 of FIG. 28 is one such array configuration. In preferred embodiments, system 2800 is utilized as a heat engine such that thermal energy from heat source 2840 is converted into useful amounts of electrical energy across load resistor 2860. In this manner, system 2300 is not removing the effects of Johnson noise. Rather, system 2300 converts unusually high spikes of Johnson noise into a useable energy source.

System 2800 includes any number of nanometer-scale electromechanical switches 2801–2806. Each one of nanometer-scale beams 2801–2806 is preferably coupled to one resistor 2811–2816, respectively. Furthermore, electric charges 2821–2826 are applied around nanometer-scale beams 2801–2806, respectively. Electric charges 2821–2826 are preferably generated from base voltage source 2850. The conversion of thermal energy to a useful amount of electrical energy occurs as follows. Persons skilled in the art will appreciate that if nanometer-scale beams 2801–2806 are included as nanotubes then resistors 2811–2816 may not be required. This is because nanotubes exhibit resistive qualities and, therefore, may be the source of Johnson noise in system 2800. In this manner, any component of system 2800 that has a resistive quality may be the source of Johnson noise in system 2800.

One or more heat sources 2840 is applied to resistors 2811–2816, respectively. As a result, thermal noise (i.e., Johnson Noise) is produced in the resistors. The thermal noise of resistors 2811–2816 creates an electric charge on the end of the respective mechanical switch 2801–2806. Preferably, if electric charges 2821–2826 have an appropriate intensity and a polarity opposite that of the polarity of the charge of mechanical switches 2801–2806, mechanical switches 2801–2806 will electrically couple (creating a galvanic connection) to contacts 2831–2836, respectively. Current created from the electrical couplings of switches 2801–2806 to contacts 2831–2836, respectively, are then added together and placed through load resistor 2860.

Thus, the voltage across load resistor 2860 may be used as electrical energy. Similarly, the heat produced by load resistor 2860 may be used as thermal energy. Additional thermal sources and mechanical switches could be added to system 2800 to increase the amount of voltage across load resistor 2860. Persons skilled in the art will appreciate that, in preferred embodiments, only resistors 2811–2816 that are generating an unusually high spike of Johnson noise will result in charges being produced at the end of nanometer-scale beams 2801–2806 large enough to close nanometer-scale beams 2801–2806 into contacts 2831–2836.

Thus, it is beneficial to include at least two parallel sources of thermal noise in system 2800. This may be done in many ways. As shown in system 2800, multiple instances of a switch are placed together in both parallel and series configurations where each switch has its own source of thermal noise. Other embodiments may easily be realized and constructed in accordance with the principles of the present invention. For example, two or more switches may be constructed together in only a parallel configuration. Moreover, each switch of the present invention may be coupled to more than one source of thermal noise. Preferably, voltage from base voltage source 2850 is adjusted such that at least 10% of the mechanical switches of system 2800 are electrically coupled (again, creating a galvanic connection) to respective contacts at any given time.

Persons skilled in the art will appreciate that the nanometer scale electrical assemblies (e.g., assembly 2890) of system 2800 may be replaced by transistors 2700 or 2800 of FIGS. 27 and 28, respectively. Thus, mechanical switch 2801 of assembly 2890 may be employed as a nanotube or, for example, be manipulated by a magnetic field. Switches 2801–2806 may also be configured such that an electrical coupling to contacts 2831–2836 only occurs for a thermal noise voltage of a specific polarity and a minimum magnitude. Persons skilled in the art will appreciate that resistors 2811–2816 may be seen as converting energy from one form to another while nanometer-scale beams 2801–2806 regulate the amount of energy that is provided across load resistor 2860. Persons skilled in the art will appreciate that nanometer-scale beams also differentiate and regulate between high and low spikes of Johnson-noise voltage (or any voltage supplied to nanometer-scale beams 2801–2806).

Figure 29:
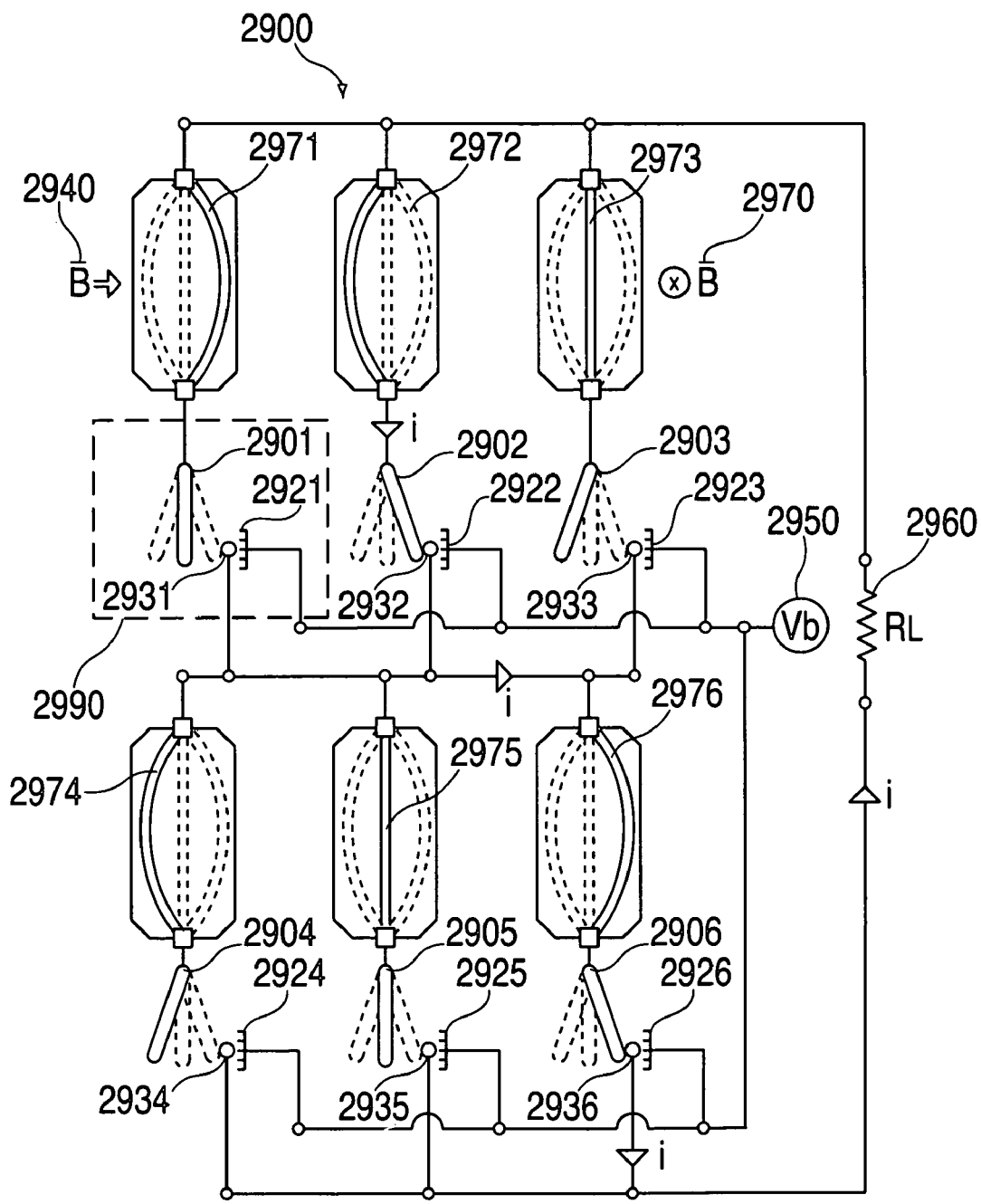
FIG. 29 is a circuit schematic of a nanometer scale electromechanical system constructed in accordance with the principles of the present invention.

Looking at FIG. 29, nanometer scale electromechanical system 2900 is provided. System 2900 is similar to system 2800 of FIG. 8. Particularly, components 28XX are the same as components 29XX.

Nanotubes 2971–2976 preferably are immersed in magnetic field 2970 such that the movement of nanotubes 2971–2976 due to heat source 2940 creates an electrical charge on nanometer-scale beams 2901–2906, respectively. Each end of nanotubes 2971–2976 may be electrically coupled to mounting points and slack may be provided between these mounting points such that motion can occur. In this manner, nanotubes 2971–2976 may be similar to, for example, system 1100 or the nanotubes of system 1100 of FIG. 11. Nanometer-scale beams 2901–2906 are preferably configured to only electrically couple with contacts 2931–2936 when nanotubes 2971–2976, respectively, create an electrical charge at the free moving ends of nanometer-scale beams 2901–2906 having a specific polarity and minimum magnitude. Persons skilled in the art will appreciate that nanotubes 2971–2976 may be seen as converting energy from one form to another while nanometer-scale beams 2901–2906 regulate the amount of energy that is provided across load resistor 2960.

System 2900 can be utilized to convert the heat of a working substance, such as air, into useable electrical energy by using nanotubes 2971–2976 to selectively slow down the molecules of the working substance. Molecules exhibiting high velocities that impact nanotubes 2971–2976 will cause nanotubes 2971–2976 to move through field 2970 and generate a voltage on nanometer-scale beams 2901–2906, respectively. As a result, nanometer-scale beams 2901–2906 will be provided an electrical charge at the tip of the free moving portion and, if large enough to attract to the charge of layers 2921–2926, respectively, will close to make a galvanic connection with contacts 2931–2936. As illustrated in system 2900, nanometer-scale beams 2902 and 2906 are closed upon contacts 2932 and 2936, respectively. The voltages generated by nanotubes 2972 and 2976 are combined and switched into main current through load resistor 2960. In this manner, the kinetic energy of the working fluid is converted to useable electrical energy. System 2900 can be used in a variety of applications such as, for example, propulsion applications.

Persons skilled in the art will appreciate that system 2800 of FIG. 28 and system 2900 of FIG. 29 may be employed in a variety of useful applications. For example, system 2800 of FIG. 28 may be placed in the proximity of a microprocessor and utilized to convert any heat expelled by the microprocessor into a useful amount of electrical energy (e.g., a time-varying DC signal). In turn, this electrical energy may then be fed back into the microprocessor in order to reduce the microprocessor's power consumption and reduce the magnitude of input power needed to operate the microprocessor while simultaneously cooling the microprocessor.

Persons skilled in the art will appreciate that two components do not have to be connected or coupled together in order for these two components to electrically interact with each other. Thus, persons skilled in the art will appreciate that two components are electrically coupled together, at least for the sake of the present application, when one component electrically affects the other component. Electrical coupling may include, for example, physical connection or coupling between two components such that one component electrically affects the other, capacitive coupling, electromagnetic coupling, free charge flow between two conductors separated by a gap (e.g., vacuum tubes), and inductive coupling.

From the foregoing description, persons skilled in the art will recognize that this invention provides nanometer scale electromechanical assemblies and systems that may be used to convert one form of energy to another. These assemblies and systems may be used to provide, for example, heat engines, heat pumps or propulsion devices. In addition, persons skilled in the art will appreciate that the various configurations described herein may be combined without departing from the present invention. For example, the nanotubes shown in FIG. 4 may be mounted directly to piezoelectric generators of FIG. 4, instead of the configuration shown. As per another example, system 2900 of FIG. 29 may be utilized to propel the sphere of FIG. 17. It will also be recognized that the invention may take many forms other than those disclosed in this specification. Accordingly, it is emphasized that the invention is not limited to the disclosed methods, systems and apparatuses, but is intended to include variations to and modifications thereof which are within the spirit of the following claims.

What is claimed is:

1. An energy conversion and regulation system comprising:
   a base member;
   a system output;
   a plurality of parallel arrays, wherein at least two of said plurality of parallel arrays are electrically connected in series, each one of said plurality of parallel arrays comprising:
      a plurality of generator-switch assemblies electrically connected in parallel and electrically connected to said system output, wherein each of generator-switch assemblies comprises:
         a generator coupled to said base member that converts thermal energy into a time-varying electrical signal; and
         a nanometer-scale switch coupled to said base member, wherein said switch is electrically connected in series with said generator such that said switch automatically closes in reaction to said time-varying electrical signal having at least a minimum non-zero magnitude.

2. The system of claim 1, wherein said generator comprises a piezoelectric generator.

3. The system of claim 1, further comprising a source of heat for supplying said thermal energy.

4. The system of claim 1, further comprising a working fluid, wherein said plurality of parallel arrays is immersed in said working fluid.

5. The system of claim 1, further comprising at least a partial vacuum, wherein said plurality of parallel arrays is immersed in said at least partial vacuum.

6. The system of claim 1, wherein said nanometer-scale switch comprises a nanotube.

7. The system of claim 1, wherein said generator comprises an electromotive force generator.

8. The system of claim 1, wherein said generator comprises at least a first lead and a second lead.

9. The system of claim 8, wherein said time-varying signal is a voltage and said minimum non-zero magnitude is greater than the average amount of voltage created by Johnson noise located between said first and second leads.

10. The system of claim 1, wherein said generator produces said time-varying signal in two polarities and said nanometer-scale switch is operable to close only in one of said two polarities.

11. The system of claim 1, wherein said generator comprises:
a first conductive layer;
a piezoelectric layer; and
a second conductive layer, wherein said piezoelectric layer is located between said first conductive layer and said second conductive layer.

12. The system of claim 11, wherein said nanometer-scale switch is provided between said second conductive layer and said base.

13. The system of claim 1, wherein said generator comprises a resistor.

14. The system of claim 12, wherein the distance between said nanometer-scale switch and said second conductive layer is chosen such that when said switch closes said at least minimum non-zero magnitude is provided.

15. The system of claim 1, wherein said generator comprises a nanotube and said nanotube is immersed in a magnetic field.

16. The system of claim 1, wherein said generator is a nanometer-scale beam having a resistance and at least a part of said time-varying signal is provided as a result of Johnson noise from said resistance.

17. The system of claim 1, wherein said generators in said plurality of generator-switch assemblies comprises:
a first conductive layer;
a piezoelectric layer; and
a second conductive layer, wherein said piezoelectric layer is located between said first and second conductive layers and all of said first conductive layers of said plurality of generator-switch assemblies within each of said parallel arrays are coupled together.

18. The system of claim 1, further comprising a magnetic field.

19. The system of claim 1, further comprising a magnetic field, wherein said generator is immersed in said magnetic field.

20. The system of claim 1, wherein said output terminal is coupled to a resistor.

21. The system of claim 1 further comprising a load resistor, wherein said plurality of parallel assemblies provide two output terminals and said load resistor is coupled between said output terminals.

22. The system of claim 1, further comprising a magnetic field, wherein said nanometer-scale switch is immersed in said magnetic field.

23. The system of claim 1, wherein said plurality of parallel assemblies are immersed in a magnetic field.

24. The system of claim 1, wherein said generator is a nanometer-scale beam having a resistance and said time-varying signal is provided as a result of Johnson noise from said resistance.

25. The system of claim 1, wherein said generator further comprises:
an electrically conductive nanometer-scale beam; and
a resistor coupled in series with said nanometer-scale beam.

26. The system of claim 25, wherein said nanometer-scale beam is a nanotube.

27. The system of claim 25, wherein said nanometer-scale beam is mechanically flexible.

28. The system of claim 27, wherein said nanometer-scale switch comprises a conductive contact located in the proximity of said nanometer-scale beam such that said nanometer-scale beam is operable to mechanically contact said conductive contact.

29. The system of claim 27, further comprising a charge member layer located in the proximity of said nanometer-scale beam.

30. The system of claim 29, wherein a first charge of one polarity on said charge member layer causes said nanometer-scale beam having a second charge of a different polarity to mechanically contact a conductive contact.

31. The system of claim 1, wherein said generator comprises a resistor and said nanometer-scale switch comprises a nanometer-scale transistor.

32. The system of claim 1, wherein said generator comprises a nanotube suspended between mounting points.

33. The system of claim 32, wherein said nanometer-scale switch comprises a nanometer-scale transistor.

34. The system of claim 32, further comprising a magnetic field, wherein said suspended nanotube is immersed in said magnetic field.

35. The system of claim 1, wherein at least one of said nanometer-scale switches in each plurality of parallel arrays is closed.

36. The system of claim 35, wherein said at least one switches in each plurality of parallel arrays is closed at any given point in time.

37. An energy conversion and regulation system comprising:
a base member;
a plurality of parallel arrays, each one of said plurality of parallel arrays comprising:
a plurality of generator-switch assemblies electrically connected in parallel, wherein each of said plurality of generator-switch assemblies comprises:
a generator coupled to said base member that converts thermal energy into a time-varying signal; and
a nanometer-scale switch coupled to said base member wherein said switch is electrically connected in series with said generator such that said switch automatically closes in reaction to said time-varying electrical signal having at least a minimum non-zero magnitude.

38. The system of claim 37, wherein said generator comprises a piezoelectric generator.

39. The system of claim 37, further comprising a source of heat for supplying said thermal energy.

40. The system of claim 37, further comprising a working fluid, wherein said plurality of parallel arrays is immersed in said working fluid.

41. The system of claim 37, further comprising at least a partial vacuum, wherein said plurality of parallel arrays is immersed in said at least partial vacuum.

42. The system of claim 37, wherein said nanometer-scale switch comprises a nanotube.

43. The system of claim 37, wherein said generator comprises an electromotive force generator.

44. The system of claim 37, wherein said generator comprises at least a first lead and a second lead.

45. The system of claim 44, wherein said time-varying signal is a voltage and said minimum non-zero magnitude is greater than the average amount of voltage created by Johnson noise located between said first and second leads.

46. The system of claim 37, wherein said generator produces said time-varying signal in two polarities and said nanometer-scale switch is operable to close only in one of said two polarities.

47. The system of claim 37, wherein said generator comprises:
a first conductive layer;
a piezoelectric layer; and
a second conductive layer, wherein said piezoelectric layer is located between said first conductive layer and said second conductive layer.

48. The system of claim 47, wherein said nanometer-scale switch is provided between said second conductive layer and said base.

49. The system of claim 37, wherein said generator comprises a resistor.

50. The system of claim 48, wherein the distance between said nanometer-scale switch and said second conductive layer is chosen such that when said switch closes said at least minimum non-zero magnitude is provided.

51. The system of claim 37, wherein said generator comprises a nanotube and said nanotube is immersed in a magnetic field.

52. The system of claim 37, wherein said generator is a nanometer-scale beam having a resistance and at least a part of said time-varying signal is provided as a result of Johnson noise from said resistance.

53. The system of claim 37, wherein said generators in said plurality of generator-switch assemblies comprises:
a first conductive layer;
a piezoelectric layer; and
a second conductive layer, wherein said piezoelectric layer is located between said first and second conductive layers and all of said first conductive layers of said plurality of generator-switch assemblies within each of said parallel arrays are coupled together.

54. The system of claim 37, further comprising a magnetic field.

55. The system of claim 37, further comprising a magnetic field, wherein said generator is immersed in said magnetic field.

56. The system of claim 37, wherein said plurality of parallel arrays are connected in a series configuration with one another.

57. The system of claim 37 further comprising a load resistor, wherein said plurality of parallel assemblies provide two output terminals and said load resistor is coupled between said output terminals.

58. The system of claim 37, further comprising a magnetic field, wherein said nanometer-scale switch is immersed in said magnetic field.

59. The system of claim 37, wherein said plurality of parallel assemblies are immersed in a magnetic field.

60. The system of claim 37, wherein said generator is a nanometer-scale beam having a resistance and said time-varying signal is provided as a result of Johnson noise from said resistance.

61. The system of claim 37, wherein said generator further comprises:
an electrically conductive nanometer-scale beam; and
a resistor coupled in series with said nanometer-scale beam.

62. The system of claim 61, wherein said nanometer-scale beam is a nanotube.

63. The system of claim 61, wherein said nanometer-scale beam is mechanically flexible.

64. The system of claim 63, wherein said nanometer-scale switch comprises a conductive contact located in the proximity of said nanometer-scale beam such that said nanometer-scale beam is operable to mechanically contact said conductive contact.

65. The system of claim 63, further comprising a charge member layer located in the proximity of said nanometer-scale beam.

66. The system of claim 65, wherein a first charge of one polarity on said charge member layer causes said nanometer-scale beam having a second charge of a different polarity to mechanically contact a conductive contact.

67. The system of claim 37, wherein said generator comprises a resistor and said nanometer-scale switch comprises a nanometer-scale transistor.

68. The system of claim 37, wherein said generator comprises a nanotube suspended between mounting points.

69. The system of claim 68, wherein said nanometer-scale switch comprises a nanometer-scale transistor.

70. The system of claim 68, further comprising a magnetic field, wherein said suspended nanotube is immersed in said magnetic field.

71. The system of claim 37, wherein at least one of said nanometer-scale switches in each plurality of parallel arrays is closed.

72. The system of claim 71, wherein said at least one switches in each plurality of parallel arrays is closed at any given point in time.

* * * * *